United States Patent
Shiga et al.

(10) Patent No.: US 7,397,687 B2
(45) Date of Patent: Jul. 8, 2008

(54) FERROELECTRIC MEMORY DEVICE HAVING FERROELECTRIC CAPACITOR

(75) Inventors: Hidehiro Shiga, Kamakura (JP); Shinichiro Shiratake, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 11/447,940

(22) Filed: Jun. 7, 2006

(65) Prior Publication Data

US 2006/0279977 A1 Dec. 14, 2006

(30) Foreign Application Priority Data

Jun. 8, 2005 (JP) ............... 2005-168589

(51) Int. Cl.
*G11C 11/22* (2006.01)
*G11C 11/24* (2006.01)

(52) U.S. Cl. ...................... 365/145; 365/149
(58) Field of Classification Search ............... 365/145, 365/149
See application file for complete search history.

(56) References Cited

U.S. PATENT DOCUMENTS

| | | | | |
|---|---|---|---|---|
| 5,400,275 A | * | 3/1995 | Abe et al. ................... | 365/145 |
| 5,539,279 A | * | 7/1996 | Takeuchi et al. ............ | 365/145 |
| 5,600,587 A | * | 2/1997 | Koike ......................... | 365/145 |
| 5,917,746 A | * | 6/1999 | Seyyedy ..................... | 365/145 |
| 5,991,188 A | * | 11/1999 | Chung et al. ................ | 365/145 |
| 5,999,439 A | * | 12/1999 | Seyyedy ..................... | 365/145 |
| 6,285,576 B1 | * | 9/2001 | Kang .......................... | 365/145 |
| 6,760,247 B2 | * | 7/2004 | Komatsuzaki ............... | 365/145 |
| 6,856,573 B2 | * | 2/2005 | Allen et al. .................. | 365/145 |
| 6,950,327 B2 | * | 9/2005 | Shimada et al. ............. | 365/145 |
| 6,950,328 B2 | * | 9/2005 | Roehr et al. ................. | 365/145 |
| 7,068,529 B2 | * | 6/2006 | Kang .......................... | 365/145 |
| 7,139,187 B2 | * | 11/2006 | Suzuki ........................ | 365/145 |
| 7,149,137 B2 | * | 12/2006 | Rodriguez et al. .......... | 365/145 |
| 7,212,428 B2 | * | 5/2007 | Jeong et al. ................. | 365/145 |
| 7,266,009 B2 | * | 9/2007 | Chandler et al. ............ | 365/145 |

FOREIGN PATENT DOCUMENTS

JP 8-212771 8/1996

* cited by examiner

*Primary Examiner*—Trong Phan
(74) *Attorney, Agent, or Firm*—Oblon, Spivak, McClelland, Maier & Neustadt, P.C.

(57) ABSTRACT

A ferroelectric memory device includes a cell block, a bit line, and a plate line. The cell block includes a ferroelectric capacitor and a transistor switch. The bit line applies a voltage to one electrode of the ferroelectric capacitor. The plate line applies a voltage to the other electrode of the ferroelectric capacitor. In a read operation of data, a first voltage is applied to the plate line. In a write operation of data, a second voltage different from the first voltage is applied to the plate line, and a voltage which is higher or lower than the second voltage is applied to the bit line.

16 Claims, 12 Drawing Sheets

FERROELECTRIC MEMORY DEVICE HAVING FERROELECTRIC CAPACITOR

CROSS-REFERENCE TO RELATED APPLICATIONS

This application is based upon and claims the benefit of priority from prior Japanese Patent Application No. 2005-168589, filed Jun. 8, 2005, the entire contents of which are incorporated herein by reference.

BACKGROUND OF THE INVENTION

1. Field of the Invention

The present invention relates to a ferroelectric memory device using polarization inversion of a ferroelectric material.

2. Description of the Related Art

A ferroelectric memory device functions as a nonvolatile memory by a characteristic in which polarization remains even though an external electric field is made zero. The ferroelectric memory device has the following excellent characteristics in comparison with an existing rewritable nonvolatile memory. That is, a power consumption is small, and a random access speed is high. For this reason, the ferroelectric memory device is highly expected as a next-generation memory device.

Data reading from the ferroelectric memory device is destructive read. For this reason, after reading, the data must be written in a memory cell again. More specifically, after "0" is read from the memory cell, "0" is written-back in the memory cell. After "1" is read from the memory cell, "1" is written-back in the memory cell. The "0" writing and the "1" writing are independently performed. Therefore, cycle time required for a series of operations from the data reading to the writing of "0" and "1" is relatively long.

On the other hand, the following method is disclosed in Jpn. Pat. Appln. KOKAI Publication No. 8-212771. That is, in a reading operation and a writing operation, a voltage of a plate line is fixed to an intermediate value between a high level and a low level, and "0" writing and "1" writing are simultaneously performed. In this method, however, write time can be shortened, but a signal amount in reading decreases to about ½, and the reliability is deteriorated disadvantageously.

For this reason, a method which can increase a signal amount in reading and shorten a write time is desired.

BRIEF SUMMARY OF THE INVENTION

A ferroelectric memory device according to an aspect of the present invention includes:

a cell block including a ferroelectric capacitor and a transistor switch, the ferroelectric capacitor storing binary data by a direction of polarization of the ferroelectric capacitor;

a bit line which is connected to the cell block and applies a voltage to one electrode of the ferroelectric capacitor;

a plate line which is connected to the cell block and applies a voltage to the other electrode of the ferroelectric capacitor;

a word line connected to a gate electrode of the transistor switch; and a differential amplifier connected to the bit line, in a read operation of the data, a first voltage being applied to the plate line, a predetermined voltage being applied to the word line to activate the transistor switch for a predetermined period of time, and a change in voltage of the bit line when the transistor switch is activated being detected by the differential amplifier to read the data, and in a write operation of the data, a second voltage different from the first voltage being applied to the plate line, a predetermined voltage being applied to the word line to activate the transistor switch for a predetermined period of time, and a voltage which is higher than the second voltage or lower than the second voltage being applied to the bit line to write data in the ferroelectric capacitor,

DETAILED DESCRIPTION OF THE INVENTION

First Embodiment

Figure 1:
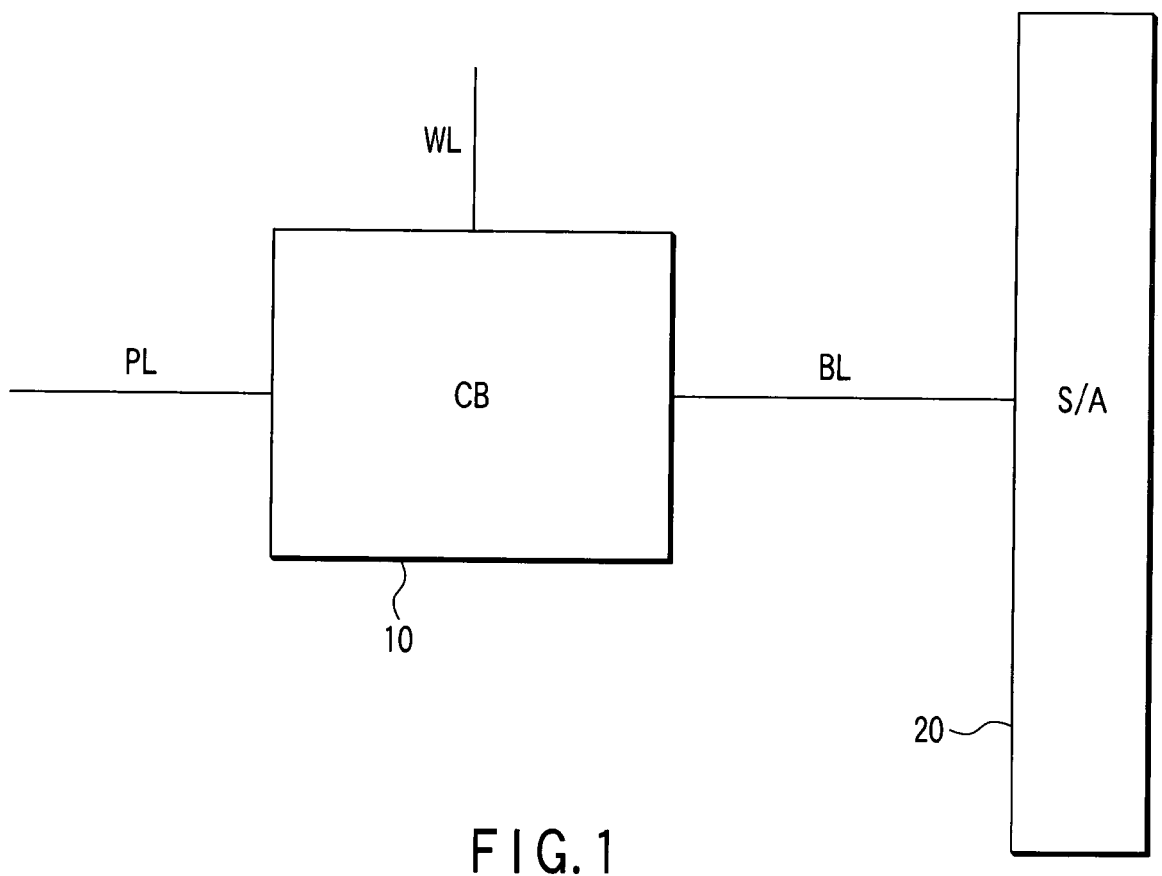
FIG. 1 is a block diagram of a ferroelectric memory device according to a first embodiment of the present invention.

A ferroelectric memory device according to a first embodiment of the present invention will be described below with reference to FIG. 1. FIG. 1 is a block diagram of the ferroelectric memory device according to the embodiment.

As shown in FIG. 1, the ferroelectric memory device according to the embodiment roughly includes a cell block (B) 10, a sense amplifier (S/A) designed as a differential amplifier 20, a word line WL, a bit line BL, and a plate line PL. One end of the cell block 10 is connected to the differential amplifier 20 through the bit line BL, and the other end of the cell block 10 is connected to the plate line PL. The cell block 10 includes a transistor switch and a ferroelectric capacitor having a ferroelectric film as a capacitive insulating film. A gate electrode of the transistor switch is connected to the word line WL.

Figure 2:
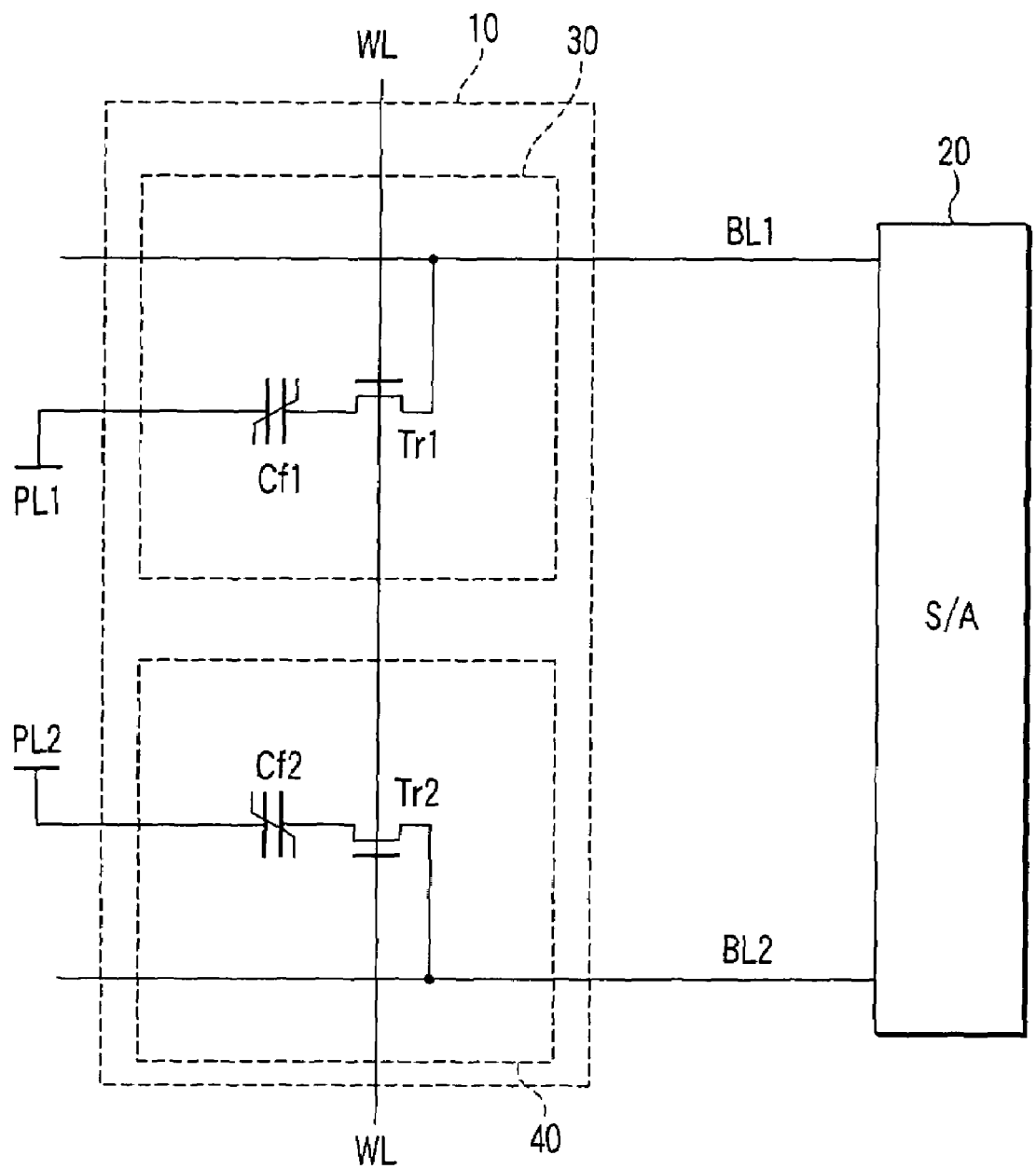
FIG. 2 is a block diagram of the ferroelectric memory device according to the first embodiment of the invention, the diagram showing a configuration of a 2T2C-type memory cell block.

FIG. 2 is a block diagram of the ferroelectric memory device according to the embodiment, and a detailed diagram showing a configuration of the cell block 10. As shown in FIG. 2, the cell block 10 according to the embodiment has a 2T2C (2-Transistor 2-Capacitor) type structure.

As shown in FIG. 2, the cell block 10 includes a first memory cell 30 and a second memory cell 40. The first memory cell 30 includes a first transistor switch Tr1 and a first ferroelectric capacitor Cf1. The second memory cell 40 includes a second transistor switch Tr2 and a second ferroelectric capacitor Cf2. The first transistor switch Tr1 and the second transistor switch Tr2 are MOS transistors, respectively. The first ferroelectric capacitor Cf1 and the second ferroelectric capacitor Cf2 are capacitor elements using ferroelectric films as capacitor insulating films. One bit of the ferroelectric memory device is formed to include the first memory cell 30 and the second memory cell 40. The bit line BL includes a first bit line BL1 and a second bit line BL2, and the plate line PL includes a first plate line PL1 and a second plate line PL2.

As the structures of the first ferroelectric capacitor Cf1 and the second ferroelectric capacitor Cf2, memory cell capacitor structures such as a plate structure, an on-plug stack structure, and a cubic stack structure can be used. A structure to be used is determined by a degree of integration or a design rule of an LSI. The structure is not limited to the memory cell capacitor structures.

As a ferroelectric films used in the first ferroelectric capacitor Cf1 and the second ferroelectric capacitor Cf2, PZT (Pb(Zr,Ti)O$_3$), SBT (SrBi$_2$Ta$_2$O$_9$), BLT((Bi,La)$_4$Ti$_3$O$_{12}$), or a material obtained by adding an impurity to these materials can be used. As a matter of course, the material of the ferroelectric film is not limited thereto.

The configurations of the first memory cell 30 and the second memory cell 40 will be described below. Gate electrodes of the first transistor switch Tr1 and the second transistor switch Tr2 are connected to a common word line WL. One electrodes of the first transistor switch Tr1 and the second transistor switch Tr2 are connected to the first bit line BL1 and the second bit line BL2, respectively. The first bit line BL1 and the second bit line BL2 are connected to the differential amplifier 20. The other electrodes of the first transistor switch Tr1 and the second transistor switch Tr2 are connected to one electrodes of the first ferroelectric capacitor Cf1 and the second ferroelectric capacitor Cf2, respectively. The other electrodes (the other electrodes may also be called plate electrodes) of the first ferroelectric capacitor Cf1 and the second ferroelectric capacitor Cf2 are connected to the first plate line PL1 and the second plate line PL2, respectively. The first plate line PL1 and the second plate line PL2 can be connected to a common plate line PL. The word line WL and the plate line PL are connected to a row decoder (not shown).

In the above configuration, the first ferroelectric capacitor Cf1 and the second ferroelectric capacitor Cf2 can hold two states ("0"/"1") which are discriminated by different polarization directions, by using polarizations of potentials applied to a ferroelectric film. In the 2T2C-type structure, opposite states are always written in the first memory cell 30 and the second memory cell 40, respectively. More specifically, when "0" is written in the first memory cell 30, "1" is written in the second memory cell 40. In contrast to this, when "1" is written in the first memory cell 30, "0" is written in the second memory cell 40. In a read state, a difference between the quantity of electric charge read from the first memory cell 30 into the first bit line BL1 and the quantity of electric charge read from the second memory cell 40 into the second bit line BL2 is extracted as a read signal.

In the 2T2C-type ferroelectric memory device according to the embodiment, a data write operation, a data read operation, and a write-back operation will be described below with reference to FIGS. 3 and 4.

Figure 3:
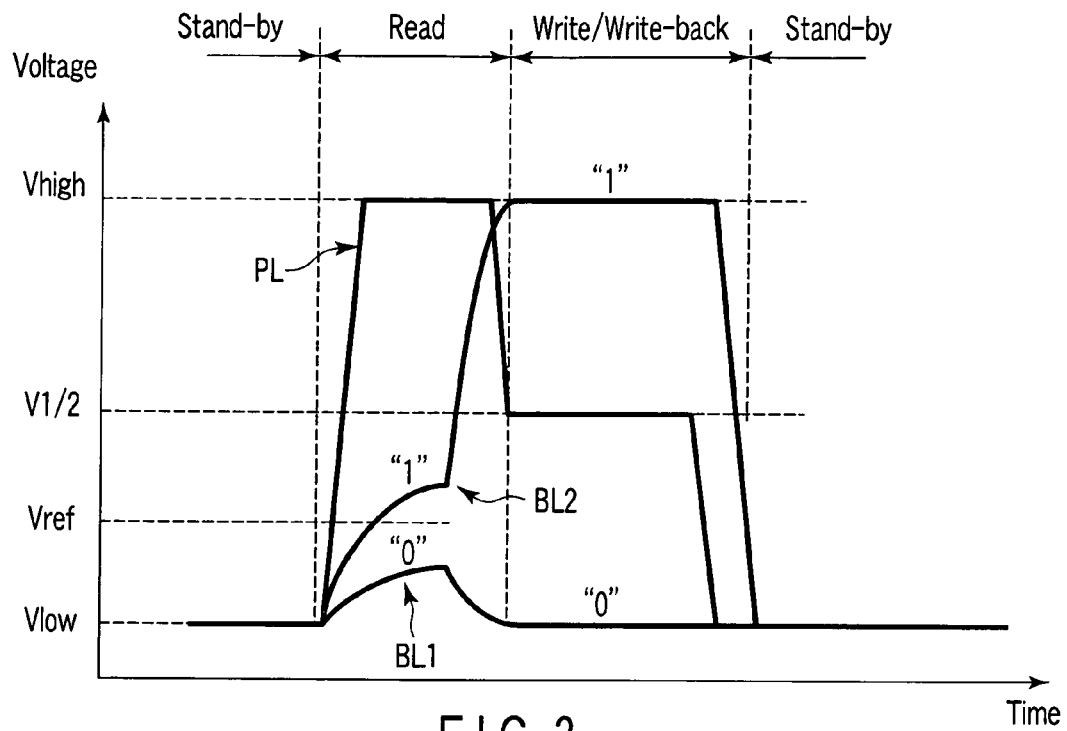
FIG. 3 is an operation timing chart of the ferroelectric memory device according to the first embodiment of the invention.

FIG. 3 is a timing chart of potentials applied to terminals in the read operations and the write operations in the first memory cell 30 and the second memory cell 40. In particular, a potential of the plate line PL, a potential of the first bit line BL1 connected to the first memory cell 30 in which "0" is written, and a potential of the second bit line BL2 connected to the second memory cell 40 in which "1" is written. FIG. 4 shows hysteresis curves of the first ferroelectric capacitor Cf1 and the second ferroelectric capacitor Cf2 to explain polarization states of the first ferroelectric capacitor Cf1 and the second ferroelectric capacitor Cf2. In FIG. 4, an abscissa indicates a voltage difference (VBL-VPL) between a bit line voltage VBL and a plate line voltage VPL. An ordinate indicates a quantity of electric charge Q accumulated in the ferroelectric capacitor. A state in which the quantity of electric charge Q is positive is defined as "1", and a state in which the quantity of electric charge Q is negative is defined as "0". A stand-by state means a state in which a write operation, a read operation, and a write-back operation are not performed.

In FIG. 3, in the stand-by state, the potentials of the plate line PL, the first bit line BL1, the second bit line BL2 are set at a low level $V_{low}$. The low level $V_{low}$ is desirably set at a voltage (about 0V) approximate to the ground level.

The write operation will be described below.

A voltage is applied to the word line WL to set the first transistor switch Tr1 of the first memory cell 30 and the second transistor switch Tr2 of the second memory cell 40 in an ON state. Subsequently, as shown in the write state in FIG. 3, the voltage of the plate line PL is latched to an intermediate voltage $V_{1/2}$ (second voltage) which is about ½ a high level $V_{high}$ (second voltage). At this time, the voltage of the first bit line BL1 connected to the first memory cell 30 in which, for example, "0" is written is latched to the low level $V_{low}$ equal to that in the stand-by state. On the other hand, the voltage of the second bit line BL2 connected to the second memory cell 40 in which "1" is written is latched to the high level $V_{high}$.

In this manner, a voltage of the low level $V_{low}$ is applied to one electrode (bit line side electrode) of the first ferroelectric capacitor Cf1, and a voltage of the high level $V_{high}$ is applied to a bit line side electrode of the second ferroelectric capacitor Cf2. As a result, the polarization state of the first ferroelectric capacitor Cf1 becomes a polarization state directed from the plate electrode side to the first bit line BL1 side. The polarization state of the second ferroelectric capacitor Cf2 becomes a polarization state directed from the second bit line BL2 side to the plate electrode PL side. More specifically, the first ferroelectric capacitor Cf1 and the second ferroelectric capacitor Cf2 are polarized in opposite directions. This manner will be described below with reference to FIG. 4. The polarization state of the first ferroelectric capacitor Cf1 of the first memory cell 30 in which "0" has been written is at a position f on the hysteresis curve. The polarization state of the second ferroelectric capacitor Cf2 of the second memory cell 40 in which "1" has been written is at a position b on the hysteresis curve. After the write operation, residual polarization obtained when an electric field applied to the first ferroelectric capacitor Cf1 and the second ferroelectric capacitor Cf2 is made zero is as follows. That is, in the first ferroelectric capacitor Cf1 in which "0" has been written, the polarization state is at a position c on the hysteresis curve. In the second ferroelectric capacitor Cf2 in which "1" has been written, the polarization state is at a position "a".

After a voltage is applied to the word line WL, a voltage is applied to the plate line PL. However, in contrast to this, a voltage may be applied to the word line WL after a voltage is applied to the plate line PL. That is, the order may be reversed.

Concrete voltage values of the high level $V_{high}$ and the intermediate voltage $V_{1/2}$ tend to be reduced with miniaturization and an increase in capacity of the semiconductor memory. As a matter of course, the value changes depending on generations of ferroelectric memory devices. When a voltage of the high level $V_{high}$ of about 1.8V is used as an example, the intermediate voltage $V_{1/2}$ is preferably set at about 0.9V. When the voltage of the high level $V_{high}$ of about 0.6V is used, the intermediate voltage $V_{1/2}$ is preferably set at about 0.3V.

The read operation will be described below.

In the ferroelectric memory device according to the embodiment, the voltage of the plate line PL is set to be higher than the voltages of the first bit line BL1 and the second bit line BL2 to perform the read operation. More specifically, the read operation is performed by an operation equivalent to that of the write operation of "0". For this reason, all data become "0" after the read operation. Therefore, the read method is called "destructive read".

As shown in FIG. 3, a voltage of the low level $V_{low}$ is applied to the first bit line BL1 and the second bit line BL2. Thereafter, the first bit line BL1 and the second bit line BL2 are electrically opened. Consequently, the potentials of the first bit line BL1 and the second bit line BL2 are set in a floating state at the low level $V_{low}$. Thereafter, a voltage is applied to the word line WL common in the first memory cell 30 and the second memory cell 40 to turn on the first transistor switch Tr1 of the first memory cell 30 and the second transistor switch Tr2 of the second memory cell 40. Furthermore, the voltage of the plate line PL common in the first memory cell 30 and the second memory cell 40 is latched to the high level $V_{high}$.

Figure 4:
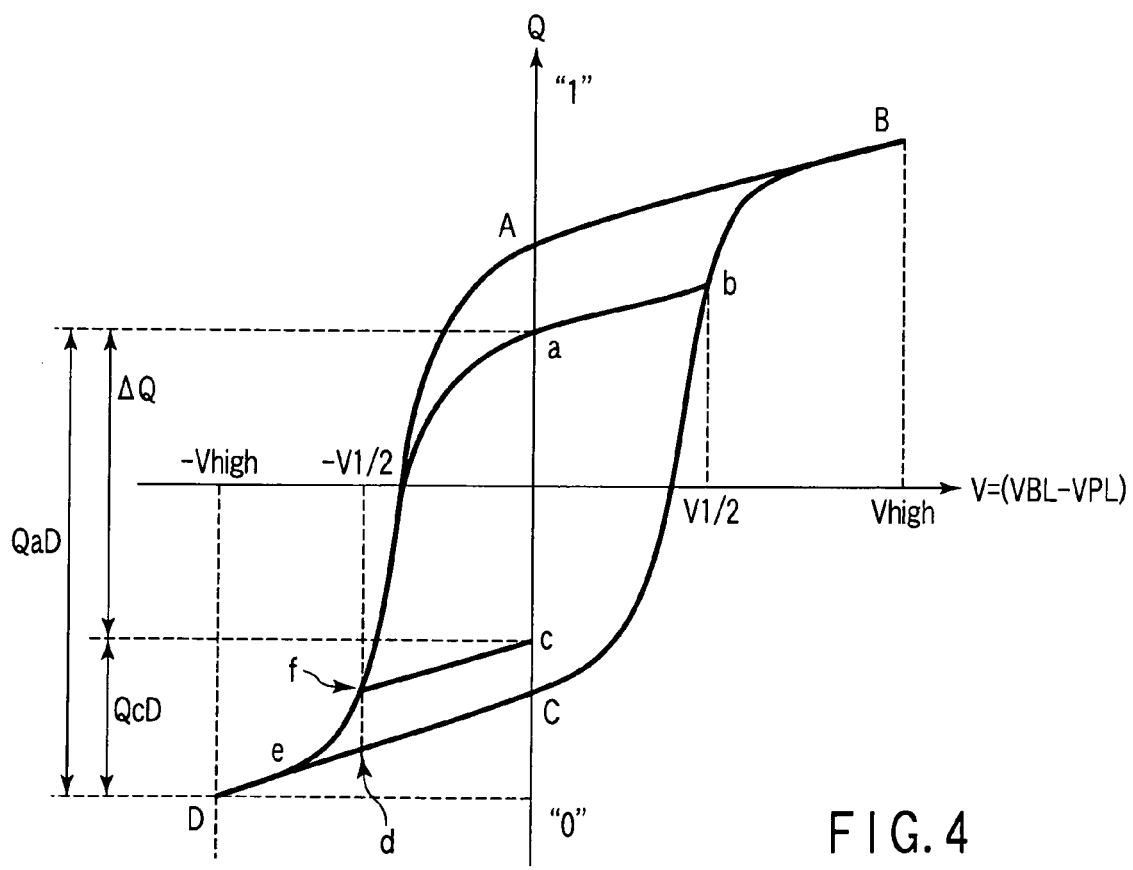
FIG. 4 is a graph showing a hysteresis curve of a ferroelectric capacitor according to the first embodiment of the invention.

In this manner, the polarization state of the first ferroelectric capacitor Cf1 of the first memory cell 30 in which "0" has been written moves from the position C to the position D on the hysteresis curve in FIG. 4. As a result, charges of a quantity of electric charge QcD are discharged to the first bit line BL1. The polarization state of the second ferroelectric capacitor Cf2 of the second memory cell 40 in which "1" has been written moves from the position "a" to the position D on the hysteresis curve in FIG. 4. As a result, charges of a quantity of electric charge QaD are discharged to the second bit line BL2.

At this time, a change in minute voltage corresponding to a difference ($\Delta Q=QaD-QcD$) between the quantity of electric charge QcD of the first memory cell 30, the charge being discharged to the first bit line BL1, and the quantity of electric charge QaD of the second memory cell 40, the charge being discharged to the second bit line BL2, is detected in such a manner that the voltage is amplified by the differential amplifier 20. As a consequence, it is determined that the first memory cell 30 holds "0" and that the second memory cell 40 holds "0", and the read operation is completed.

When data is read by the above method, it is preferable that the voltage applied to the plate line PL in reading is large because the amount of the read signal increases along with the voltage. In the embodiment, a conventional plate voltage in reading is set at a high level $V_{high}$ higher than the intermediate voltage $V_{1/2}$ in writing. For this reason, changes in voltage generated on a bit line from which "0" is read and a bit line from which "1" is read are increased to make it possible to improve the reliability of reading.

Now, the write-back operation will be described. The write-back operation is performed as described below like the write operation.

The voltage of the word line WL common in the first memory cell 30 and the second memory cell 40 in which data is written back is kept in a voltage applied state. More specifically, the first and second transistors Tr1 and Tr2 are held in an ON state. The voltage of the plate line PL is latched to the intermediate voltage $V_{1/2}$ which is about ½ the high level $V_{high}$. At this time, the voltage of the first bit line BL1 to which the first memory cell 30 in which "0" is written back is connected, is set at a voltage lower than the voltage of the plate line PL. In contrast to this, the voltage of the second bit line BL2 to which the second memory cell 40 in which "1" is written back is connected, is set at a value higher than the voltage of the plate line PL. More specifically, for example, the voltage of the bit line BL connected to the first memory cell 30 in which "0" is written back is set at the low level $V_{low}$ equal to the ground voltage as in the stand-by state. In contrast to this, the voltage of the second bit line BL2 connected to the second memory cell 40 in which "1" is written back is set at the high level $V_{high}$.

As described above, the voltage of the low level $V_{low}$ is applied to the bit line side electrode of the first ferroelectric capacitor Cf1, and the voltage of the high level $V_{high}$ is applied to the bit line side electrode of the second ferroelectric capacitor Cf2. As a result, the polarization state of the first ferroelectric capacitor Cf1 is a polarization state directed from the plate electrode side to the bit line side. The polarization state of the second ferroelectric capacitor Cf2 is a polarization state directed from the bit line side to the plate electrode side. More specifically, the first ferroelectric capacitor Cf1 and the second ferroelectric capacitor Cf2 are polarized in the opposite directions. The above phenomenon will be described below with reference to the hysteresis curve in FIG. 4. The polarization state of the first ferroelectric capacitor Cf1 of the first memory cell 30 in which "0" has been written back is at a position d. On the other hand, the polarization state of the second ferroelectric capacitor Cf2 of the second memory cell 40 in which "1" has been written back is at a position b. After the write-back, residual polarization obtained when electric fields applied to the first and second first ferroelectric capacitors Cf1 and Cf2 are made zero is at a position C on the hysteresis curve in the first memory cell 30 in which "0" has been written and is at a position "a" on the hysteresis curve in the second memory cell 40 in which "1" has been written.

In this manner, in the write-back method according to the embodiment, the voltage of the plate line PL is latched to the intermediate voltage $V_{1/2}$, and the first bit line BL1 and the second bit line BL2 latch a voltage higher than the voltage of the plate line PL and a voltage lower than the voltage of the plate line PL with reference to the voltage of the plate line PL. In this manner, write-back processes of "0" and "1" can be simultaneously performed to the first ferroelectric capacitor Cf1 and the second ferroelectric capacitor Cf2, so that write-back time can be shortened.

As described above, by using the method according to the first embodiment, an amount of data (the quantity of electric charge) read on the bit line in a read state can be made sufficiently large. For this reason, the reliability of the read operation can be improved. Furthermore, since "0" and "1" are simultaneously written back in the first ferroelectric capacitor Cf1 and the second ferroelectric capacitor Cf2, cycle time can be advantageously shortened.

Figure 5:
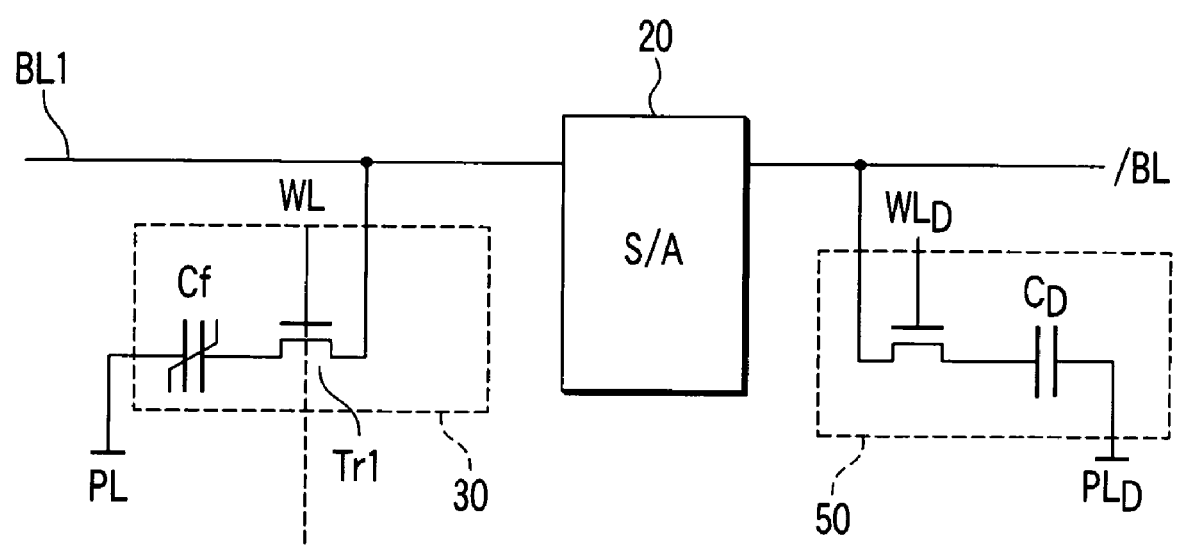
FIG. 5 is a block diagram of a ferroelectric memory device according to a modification of the first embodiment of the invention, the diagram showing a configuration of a 1T1C-type memory cell block.

The embodiment describes the case in which the present embodiment is applied to the 2T2C-type ferroelectric memory device. In the embodiment, however, the present embodiment can be applied to a ferroelectric memory device having a 1T1C-type (1-Transistor 1-Capacitor) structure. FIG. 5 is a block diagram of a ferroelectric memory device according to a modification of the embodiment, and a detailed diagram showing the 1T1C-type structure. As shown in FIG. 5, one memory cell stores one bit. In the 1T1C-type structure, a change in minute voltage corresponding to a change QaD or QcD in quantity of electric charge caused by the first ferroelectric capacitor Cf1 of the first memory cell 30 is compared with a reference voltage Vref generated by a dummy cell 50, which includes plate-line driver (PL$_D$), word line driver (WL$_D$), and dummy capacitor (CD). On the basis of the comparison result, a polarization state is determined, and data is read. By using the 1T1C-type structure, a memory capacity can be made twice that in the 2T2C-type structure. Simultaneously, the same effect as in use of the 2T2C-type structure can be obtained.

Second Embodiment

Figure 6:
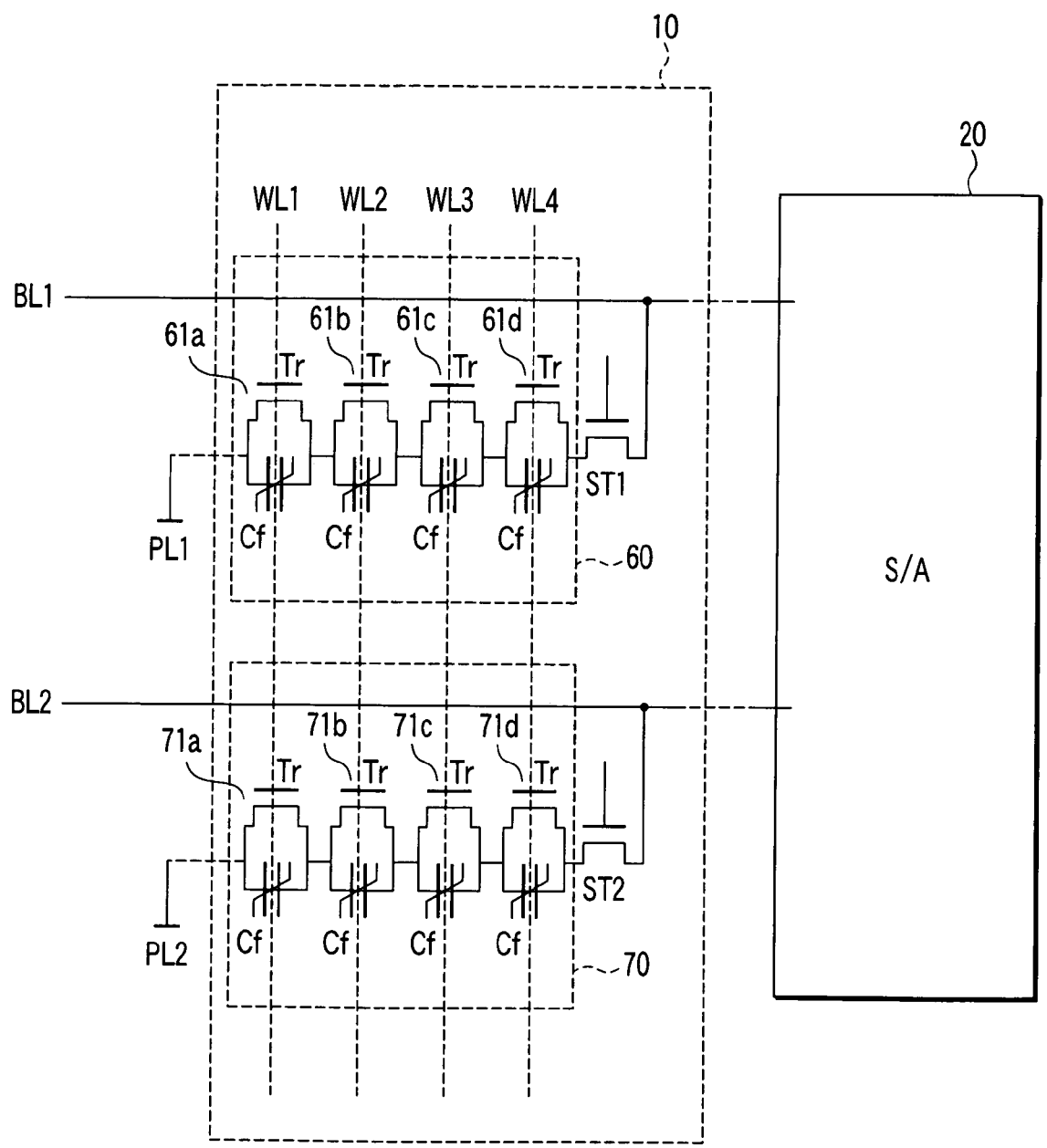
FIG. 6 is a block diagram of a Series connected TC unit type ferroelectric RAM according to a second embodiment of the present invention, the diagram showing a configuration of a 2T2C-type memory cell block.

Now, a ferroelectric memory device according to a second embodiment of the present invention will be described. In the embodiment, the first embodiment is applied to a 2T2C-type memory which consists of series connected memory cells each having a transistor having a source terminal and a drain terminal and a ferroelectric capacitor inbetween said two terminals, hereafter named "Series connected TC unit type ferroelectric RAM". FIG. 6 is a block diagram of a Series connected TC unit type ferroelectric RAM according to the embodiment. In particular, FIG. 6 shows the details of the cell block 10.

As shown in FIG. 6, the cell block 10 includes a first unit cell group 60, a second unit cell group 70, and first and second selection transistors ST1 and ST2 which determine whether or not the first unit cell group 60 and the second unit cell group 70 are selected. The first unit cell group 60 includes memory cells 61a to 61d connected in series with each other. A memory cell includes a capacitor element Cf and a transistor switch Tr connected in parallel. The second unit cell group 70 includes memory cells 71a to 71d connected in series. A memory cell includes a capacitor element Cf and a transistor switch Tr connected in parallel. More specifically, sets of a plurality of units connected in series with each other form the first unit cell group 60 and the second unit cell group 70, respectively. More specifically, in the first unit cell group 60 and the second unit cell group 70, adjacent memory cells of the memory cells 61a to 61d and the memory cells 71a to 71d share a drain electrode. In FIG. 6, each of the first unit cell group 60 and the second unit cell group 70 includes four memory cells. However, for example, the group may include 8, 16, 32, or more memory cells. By using the configuration, a ferroelectric memory device can be miniaturized. The configuration is suitable for a large-capacity ferroelectric memory device.

One ends of the first unit cell group 60 and the second unit cell group 70 are connected to the first bit line BL1 and the second bit line BL2 through the first selection transistor ST1 and the second selection transistor ST2, respectively. The first bit line BL1 and the second bit line BL2 are connected to the differential amplifier 20. The other terminals of the first unit cell group 60 and the second unit cell group 70 are connected to the first plate line PL1 and the second plate line PL2, respectively. Furthermore, gate electrodes of the transistor switches Tr included in the memory cells 61a to 61d and the memory cells 71a to 71d in the same column are connected to the same word lines WL1 to WL4. More specifically, the memory cells are arranged in the form of a matrix. As the first plate line PL1 and the second plate line PL2, a common plate line PL may be used.

In the Series connected TC unit type ferroelectric RAM, the first bit line BL1 and the second bit line BL2 are connected to the differential amplifier 20. 1 bit is formed by a pair of the memory cells, that is, one of the memory cells 61a to 61d of the first unit cell group 60 and one of the memory cells 71a to 71d of the second unit cell group 70 which are connected any one of the common word lines.

In the 2T2C-type Series connected TC unit type ferroelectric RAM, the transistor switches Tr are turned on or off to select the memory cells 61a to 61d and the memory cells 71a to 71d in which data are to be written. More specifically, when the memory cells 61b and 71b are selected, the voltage of the word line WL2 to be connected to the memory cells 61b and 71b is set at a ground voltage, and the transistor switches Tr are turned off. On the other hand, a voltage is applied to the word lines WL1, WL3, and WL4 to be connected to the unselected memory cells 61a, 61c, 61d, 71a, 71c, and 71d to turn on the transistor switches Tr of the unselected memory cells. A voltage is applied to the first bit line BL1, the second bit line BL2. A plate line voltage is applied to the first plate line PL1 and the second plate line PL2. As a result, write and read operations are performed by using polarization states of ferroelectric films in the ferroelectric capacitors Cf of the memory cells 61b and 71b.

In the 2T2C-type unit cell group structure, states which are opposite to each other are always written in the selected memory cells of the first unit cell group 60 and the second unit cell group 70 connected to the common word lines WL1 to WL4. More specifically, when "0" is written in the selected memory cells of the first unit cell group 60, "1" is written in the selected memory cells of the second unit cell group 70. In contrast to this, when "1" is written in the selected memory cells of the first unit cell group 60, "0" is written in the selected memory cells of the second unit cell group 70. In this manner, a difference between amounts of charge stored in the two memory cells is extracted as a signal. Therefore, since a read signal amount is large, the reliability of the read operation can be improved in comparison with a read operation in a method using only a signal of one memory cell.

Now, a write operation, a read operation, and a write-back operation in a Series connected TC unit type ferroelectric RAM having a 2T2C-type unit cell group according to the embodiment will be described.

Operation voltages and operation timings of the write operation, the read operation, and the write-back operation in the embodiment are the same as those in the first embodiment. The operation will be described below with reference to FIG. 3. Since the hysteresis curve of the ferroelectric capacitor Cf is the same as that in the first embodiment, the hysteresis curve will be described below with reference to FIG. 4.

FIG. 3 shows operation timings of the plate line PL, the first bit line BL1 connected to a selected memory cell in which "0" is written, and the second bit line BL2 connected to a selected memory cell in which "1" is written.

In a stand-by state, the first selected transistor ST1 and the second selected transistor ST2 are set in an OFF state. In this manner, serially connected memory cells are not connected to the first bit line BL1 and the second bit line BL2.

The write operation will be described below. In the embodiment, description will be given to, as an example, a case in which "0" is written in a selected memory cell 61b of the first unit cell group 60 connected to a word line WL2 and "1" is written in a selected memory cell 71b of the second unit cell group 70.

As shown in FIG. 3, a voltage of the word line WL2 connected to the selected memory cells 61b and 71b is set at a low level $V_{low}$, so that transistor switches Tr of the selected memory cells 61b and 71b are turned off. On the other hand, a voltage of the word lines WL1, WL3, and WL4 connected to unselected memory cells 61a, 61c, 61d, 71a, 71c, and 71d except for the selected memory cells 61b and 71b are kept in a high level $V_{high}$ or a predetermined level (for example, $V_{high}+1V$). As a result, the transistor switches Tr of the unselected memory cells 61a, 61c, 61d, 71a, 71c, and 71d are kept in on-state.

Subsequently, the voltages of the first plate line PL1 and the second plate line PL2 are latched to an intermediate voltage $V_{1/2}$ which is about ½ the high level $V_{high}$. At this time, the voltage of the first bit line BL1 connected to the selected memory cell 61b in which "0" is written is set at a voltage lower than the voltages of the first plate line PL1 and the second plate line PL2. On the other hand, the voltage of the second bit line BL2 connected to the selected memory cell 71b in which "1" is written is set at a voltage higher than the voltages of the first plate line PL1 and the second plate line PL2. More specifically, the voltage of the first bit line BL1 is set at the low level $V_{low}$ equal to that in the stand-by state, and the voltage of the second bit line BL2 is set at the high level $V_{high}$.

As a consequence, a voltage of the low level $V_{low}$ is applied to a bit line side electrode of the ferroelectric capacitor Cf of the selected memory cell 61b. On the other hand, a voltage of the high level $V_{high}$ is applied to a bit line side electrode of the ferroelectric capacitor Cf of the selected memory cell 71b. As a result, the ferroelectric capacitor Cf of the selected memory cell 61b of the first unit cell group 60 has a polarization state directed from a plate electrode side to a bit line side. On the other hand, the ferroelectric capacitor Cf of the selected memory cell 71b of the second unit cell group 70 has a polarization state directed from the bit line side to the plate electrode side. More specifically, the ferroelectric capacitor Cf of the first unit cell group 60 and the ferroelectric capacitor Cf of the second unit cell group 70 are polarized in opposite directions. The polarization states will be described with reference to FIG. 4. The polarization state of the ferroelectric capacitor Cf of the selected memory cell 61b in which "0" has been written is at a position f on the hysteresis curve. On the other hand, the polarization state of the ferroelectric capacitor Cf of the selected memory cell 61b in which "1" has been written is at a position b. As residual polarization states obtained when electric fields applied to the ferroelectric capacitors Cf of the selected memory cells 61b and 71b are made zero after the writing, a residual polarization state is at a position c on the hysteresis curve in the selected memory cell 61b, and a residual polarization state is at a position "a" on the hysteresis curve in the selected memory cell 71b.

The read operation will be described below. As shown in FIG. 3, a voltage of the low level $V_{low}$ is applied to the first bit line BL1 and the second bit line BL2. Thereafter, the first bit line BL1 and the second bit line BL2 are opened. Consequently, the potentials of the first bit line BL1 and the second bit line BL2 are set in a floating state at the low level $V_{low}$. Furthermore, a voltage of the high level $V_{high}$ is applied to the gate electrodes of the first selection transistor ST1 and the second selection transistor ST2. As a result, the first selection transistor ST1 and the second selection transistor ST2 are turned on.

Thereafter, a voltage of the word line WL2 connected to the selected memory cells 61b and 71b is set at a low level $V_{low}$. On the other hand, a voltage of the word lines WL1, WL3, and WL4 of the unselected memory cells 61a, 61c, 61d, 71a, 71c, and 71d except for the selected memory cells 61b and 71b are kept in a high level $V_{high}$. In this manner, the transistor switches Tr of the unselected memory cells 61a, 61c, 61d, 71a, 71c, and 71d are in on-state. Furthermore, a voltage of the high level $V_{high}$ is applied to the first plate line PL1 and the second plate line PL2.

As a consequence, the polarization state of the ferroelectric capacitor Cf of the selected memory cell 61b of the first unit cell group 60 in which "0" has been written moves from the position c to a position D on the hysteresis curve shown in FIG. 4. In this manner, charges of the quantity of electric charge QcD are discharged to the first bit line BL1. On the other hand, the polarization state of the ferroelectric capacitor Cf of the selected memory cell 71b of the second unit cell group 70 in which "1" has been written moves from the position "a" to the position D on the hysteresis curve shown in FIG. 4. In this manner, charges of the quantity of electric charge QaD are discharged to the second bit line BL2.

A change in voltage corresponding to a difference ($\Delta Q=QaD-QcD$) between the quantity of electric charge QcD of the selected memory cell 61b, the charge being discharged from the first bit line BL1, and the quantity of electric charge QaD of the selected memory cell 71b, the charge being discharged from the second bit line BL2, is amplified by the differential amplifier 20 to detect read data. Consequently, data read from the selected memory cell 61b of the first unit cell group 60 is determined as "0", and data read from the selected memory cell 71b of the second unit cell group 70 is determined as "1", so that the read operation is completed.

All the ferroelectric capacitors Cf from which the data have been read by the above method hold "0" regardless of held data "0" or "1". For this reason, a write-back operation is performed after the read operation. The write-back operation is performed as follows. The write-back operation will be described below.

The write-back operation is performed subsequently to the read operation. Meantime, the transistor switches Tr of the unselected memory cells 61a, 61c, 61d, 71a, 71c, and 71d are set in an ON state. In the write-back operation, the voltages of the first plate line PL1 and the second plate line PL2 are set at the intermediate voltage $V_{1/2}$ which is about ½ the high level $V_{high}$. A voltage of the first bit line BL1 connected to the selected memory cell 61b in which "0" is written back is set at a voltage lower than the voltages of the first plate line PL1 and the second plate line PL2. On the other hand, a voltage of the second bit line BL2 connected to the selected memory cell 71b in which "1" is written back is set at a voltage higher than the voltages of the first plate line PL1 and the second plate line PL2. More specifically, for example, the voltage of the first bit line BL1 is set at the low level $V_{low}$ equal to that in the stand-by state, and the voltage of the second bit line BL2 is set at the high level $V_{high}$.

As described above, a voltage of the low level $V_{low}$ is applied to the bit line side electrode of the ferroelectric capacitor Cf of the selected memory cell 61b of the first unit cell group 60. On the other hand, a voltage of the high level $V_{high}$ is applied to the bit line side electrode of the ferroelectric capacitor Cf of the selected memory cell 71b of the second unit cell group 70. As a result, the ferroelectric capacitor Cf of the selected memory cell 61b has a polarization state directed from a plate electrode side to a bit line side. The ferroelectric capacitor Cf of the selected memory cell 71b of the second unit cell group 70 has a polarization state directed from the bit line side to the plate electrode side. More specifically, the first ferroelectric capacitor Cf and the second ferroelectric capacitor Cf are polarized in opposite directions. This manner will be described below with reference to FIG. 4. The polarization state of the ferroelectric capacitor Cf of the selected memory cell 61b in which "0" has been written back is at a position d on the hysteresis curve. The polarization state of the selected memory cell 71b in which "1" has been written back is at a position b on the hysteresis curve. As residual polarization states obtained when a voltage applied to the ferroelectric capacitors Cf are made zero after the write-back operation, a residual polarization state is at a position C on the hysteresis curve in the memory cell 61b, and a residual polarization state is at a position "a" on the hysteresis curve in the memory cell 71b.

As described above, by using the write-back method according to the embodiment, the voltages of the first plate line PL1 and the second plate line PL2 are set at the intermediate voltage $V_{1/2}$, and the voltages of the first bit line BL1 and the second bit line BL2 are set at a voltage higher than the voltages of the first plate line PL1 and the second plate line PL2 and a voltage lower than the voltages of the first plate line PL1 and the second plate line PL2, respectively. In this manner, write-back processes of "0" and "1" can be simultaneously performed, and cycle time can be shortened.

Figure 7:
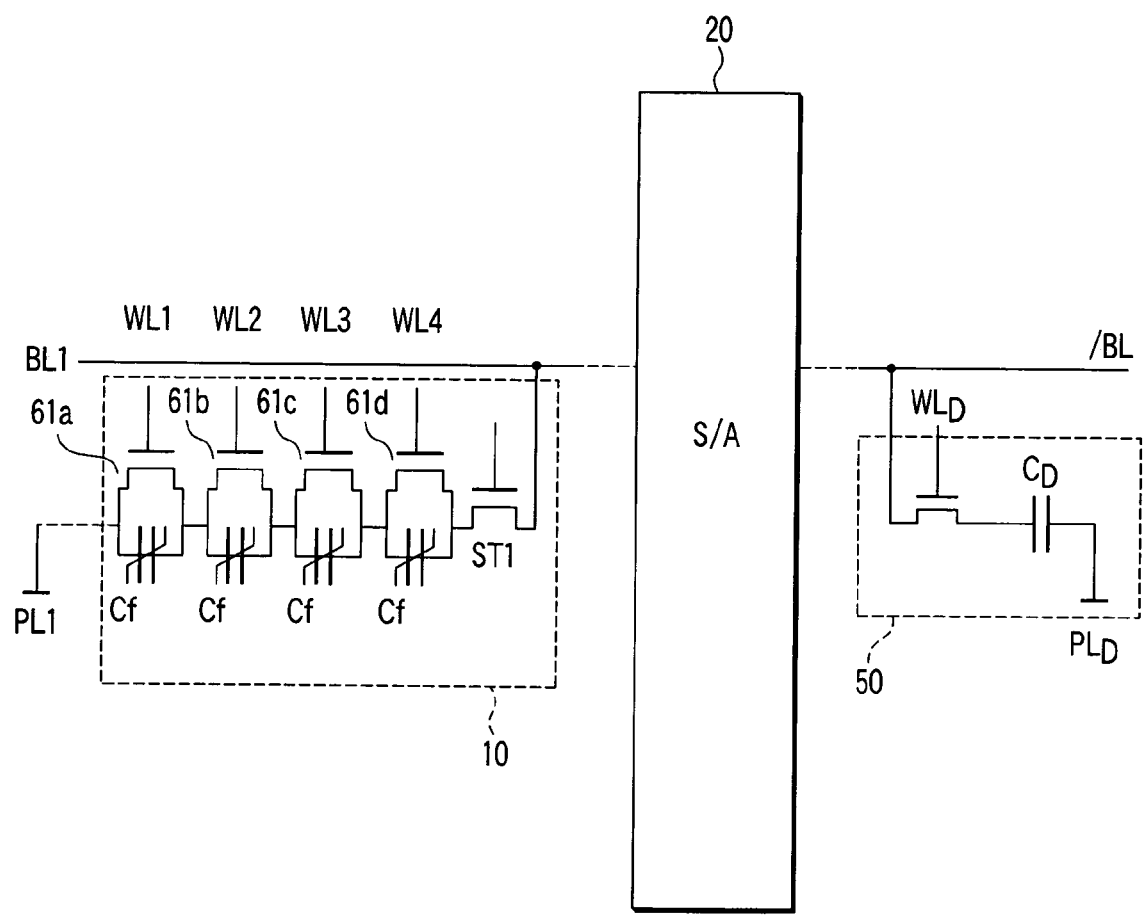
FIG. 7 is a block diagram of a Series connected TC unit type ferroelectric RAM according to a modification of the second embodiment of the invention, the diagram showing a configuration of a 1T1C-type memory cell block.

In the embodiment, the 2T2C-type Series connected TC unit type ferroelectric RAM is explained. However, the embodiment can be applied to a 1T1C-type Series connected TC unit type ferroelectric RAM. FIG. 7 is a block diagram of a Series connected TC unit type ferroelectric RAM according to a modification of the embodiment. FIG. 7 shows the details of a 1T1C structure. More specifically, bit lines connected to a differential amplifier 20 are independent from each other, and one memory cell forms one bit. The 1T1C-type Series connected TC unit type ferroelectric RAM advantageously obtain not only the same effect as that obtained in the 2T2C-type Series connected TC unit type ferroelectric RAM but also a memory capacity twice a memory capacity obtained in the 2T2C-type Series connected TC unit type ferroelectric RAM.

Third Embodiment

Now, a ferroelectric memory device according to a third embodiment of the present invention will be described. The ferroelectric memory device according to the embodiment is obtained by changing voltages of plate lines in the second embodiment. Therefore, the configuration of a Series connected TC unit type ferroelectric RAM according to the embodiment is the same as that in FIG. 6 or FIG. 7 described in the second embodiment, a description thereof will be omitted.

Figure 8:
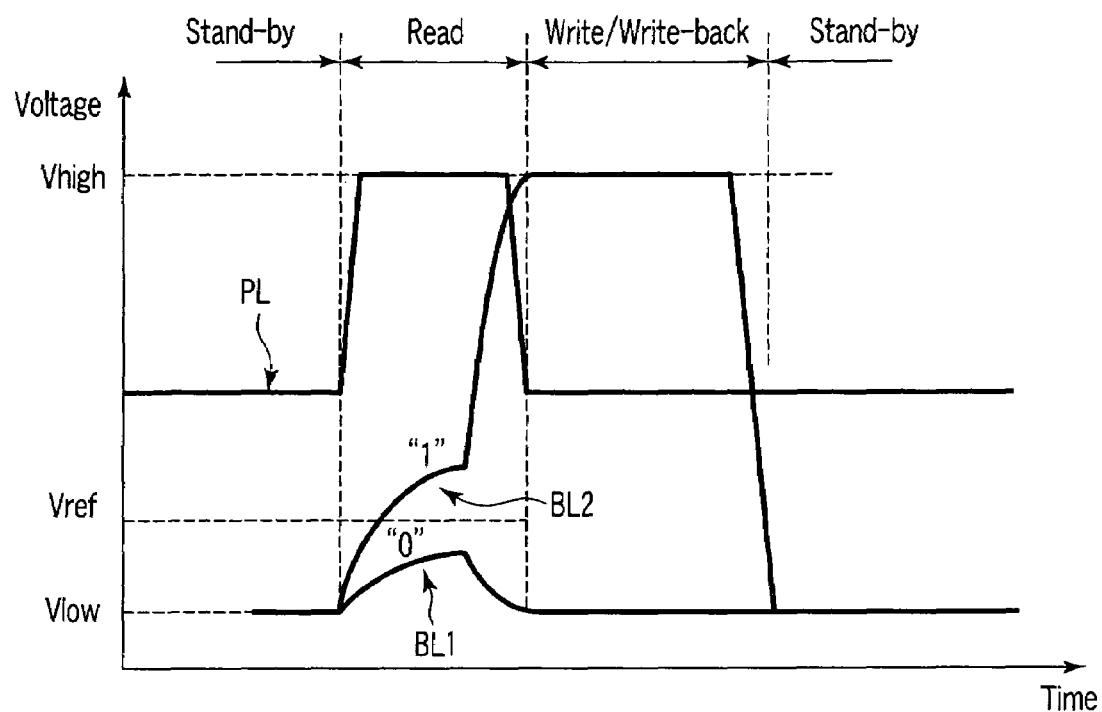
FIG. 8 is an operation timing chart of a Series connected TC unit type ferroelectric RAM according to a third embodiment of the present invention.
Figure 9:
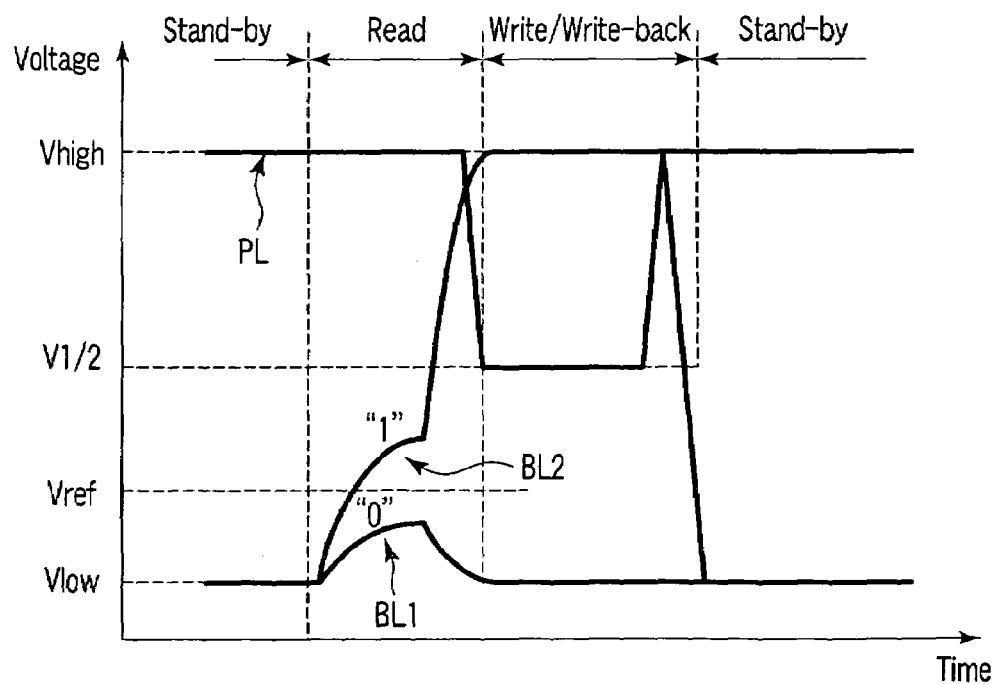
FIG. 9 is an operation timing chart of a Series connected TC unit type ferroelectric RAM according to a modification of the third embodiment of the invention.

The Series connected TC unit type ferroelectric RAM according to the embodiment is different from the first and second embodiments in potentials of plate lines in a stand-by state. FIGS. 8 and 9 are timing charts showing potentials of a plate line PL, a first bit line BL1, and a second bit line BL2 in the Series connected TC unit type ferroelectric RAM according to the embodiment.

In the first and second embodiments, the voltage of the plate line PL in the stand-by state is at a low level $V_{low}$, e.g., about 0V. In the embodiment, however, the voltage of the plate line PL in the stand-by state is set at an arbitrary value, for example $V_{1/2}$, between a high level $V_{high}$ and the low level $V_{low}$ as shown in FIG. 8, or is held at the high level $V_{high}$ as shown in FIG. 9. Other plate voltages in the read and write-back operations and other read and write-back operations are the same as those in the second embodiment.

Even in the method according to the embodiment, the effects explained in the first and second embodiments are obtained. Furthermore, in the embodiment, the stand-by voltage of the plate line PL is higher than the low level $V_{low}$. For this reason, a change in plate line potential is smaller than that in the second embodiment. Consequently, power consumptions in the read state and the write state can be reduced. Furthermore, in comparison with the second embodiment, a PL driver circuit to drive a plate line PL necessary for boosting of a plate line voltage can be reduced in size.

As a modification of the embodiment, not only a method of fixing a plate voltage in the stand-by state to a constant value but also a method of setting the plate voltage at an arbitrary voltage changing between the high level $V_{high}$ and the low level $V_{low}$.

Fourth Embodiment

Figure 10:
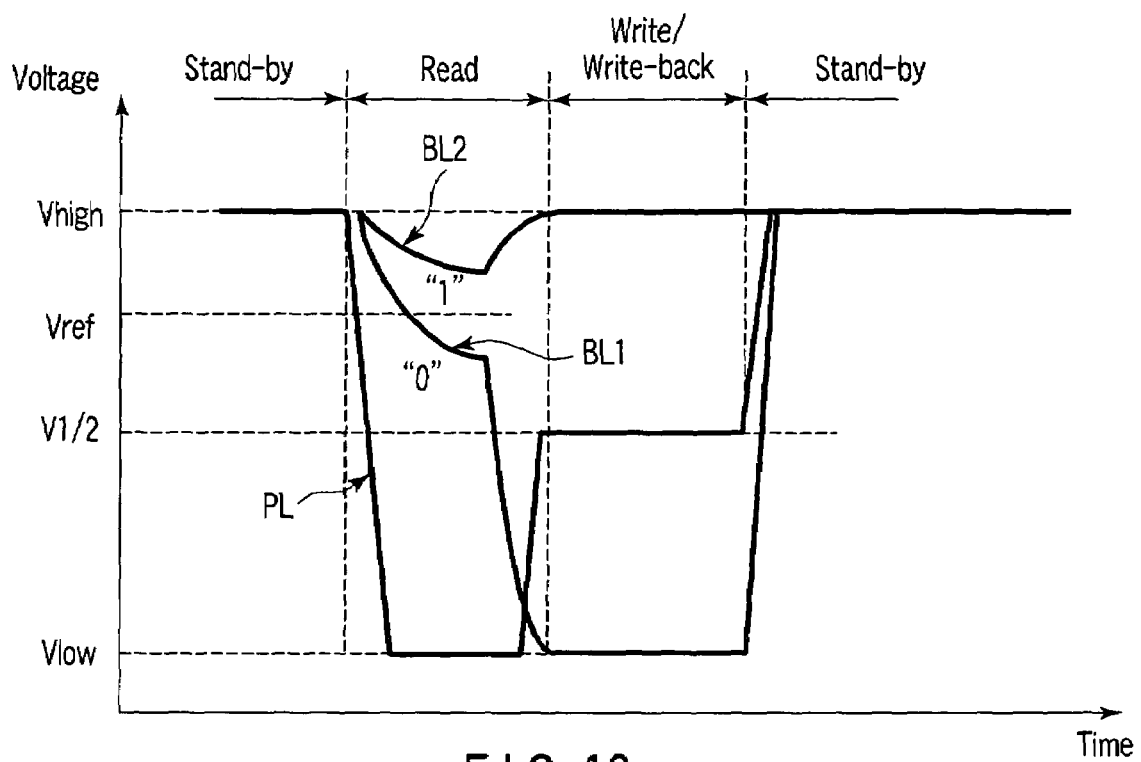
FIG. 10 is an operation timing chart of a Series connected TC unit type ferroelectric RAM according to a fourth embodiment of the present invention.
Figure 11:
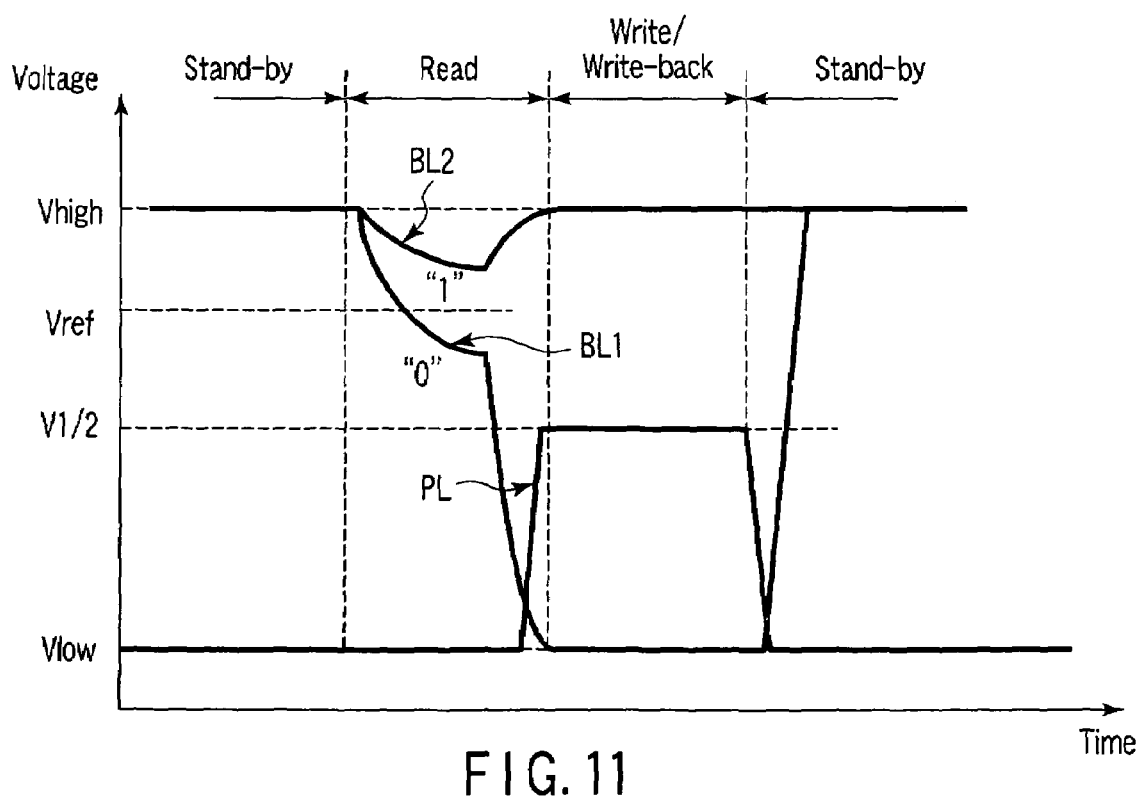
FIG. 11 is an operation timing chart of a Series connected TC unit type ferroelectric RAM according to a modification of the fourth embodiment of the invention.
Figure 12:
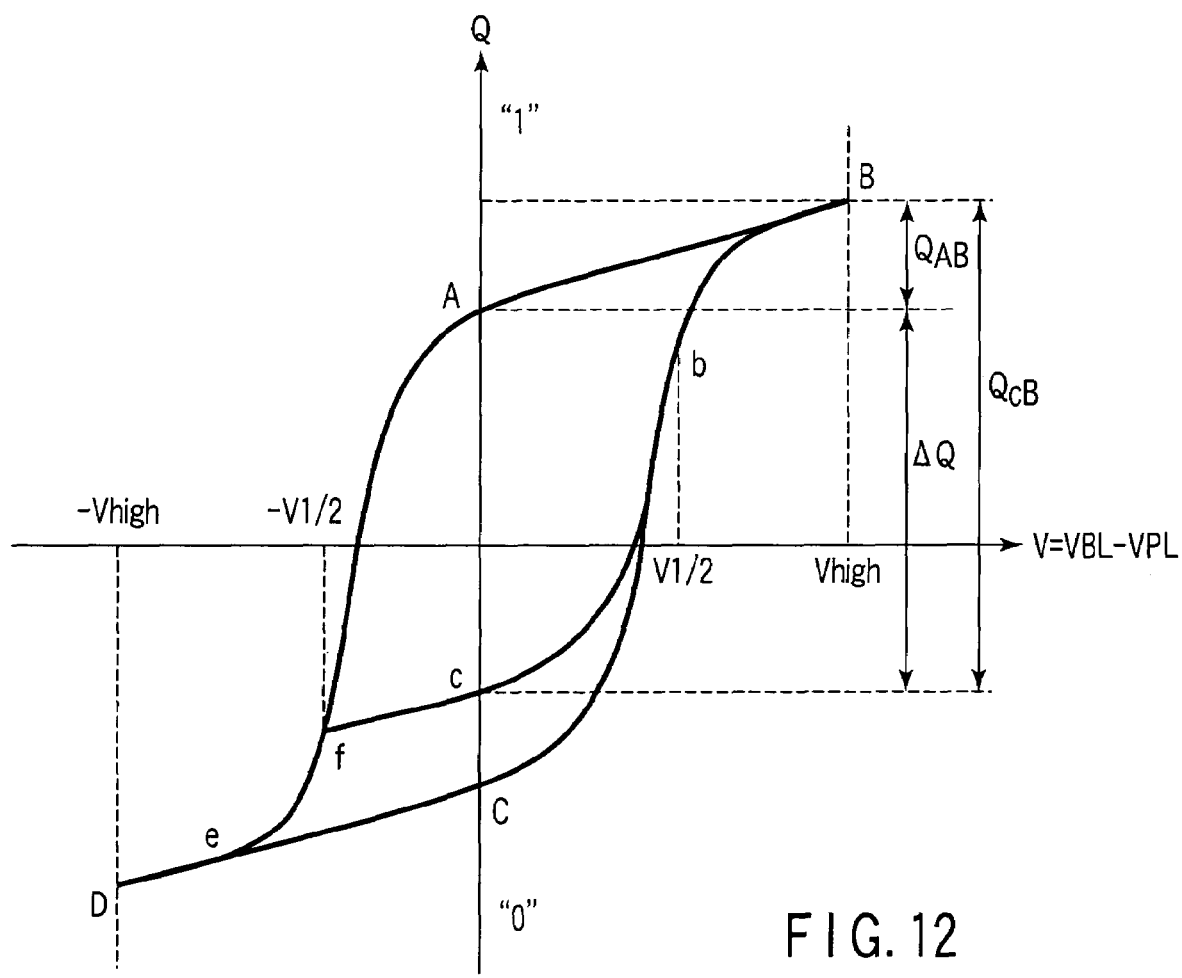
FIG. 12 is a graph showing a hysteresis curve of a ferroelectric capacitor according to the fourth embodiment of the invention.

Now, a ferroelectric memory device according to a fourth embodiment of the present invention will be described. This embodiment relates to a Series connected TC unit type ferroelectric RAM which makes a potential of a plate line PL lower than potentials of bit lines BL1 and BL2 to perform a read operation in the second embodiment. A configuration of the Series connected TC unit type ferroelectric RAM according to the embodiment, is the same as that in FIG. 6 or FIG. 7 described in the second embodiment, a description thereof will be omitted. FIGS. 10 and 11 are timing charts of potentials of the plate line PL, the first bit line BL1 connected to a selected memory cell in which "0" is written, and the second bit line BL2 connected to a selected memory cell in which "1" is written in the Series connected TC unit type ferroelectric RAM according to the embodiment. FIG. 12 shows a hysteresis curve of a ferroelectric capacitor Cf corresponding to FIGS. 10 and 11.

The embodiment is different from the first to third embodiments in that, as shown in FIGS. 10 and 11, in a read operation, a voltage of the plate line PL lower than the voltages of the first bit line BL1 and the second bit line BL2 is used. In the first to the third embodiments, the voltage of the plate line PL in the read state is at the high level $V_{high}$, and voltages approximate to the low level $V_{low}$ are used as the voltages of the first bit line BL1 and the second bit line BL2. In contrast to this, in the embodiment, the voltage of the plate line PL in the read state is latched to the low level $V_{low}$. The voltages of the first bit line BL1 and the second bit line BL2 are latched to a voltage approximate to the high level $V_{high}$. Although the voltage of the plate line PL in a stand-by state is at the high level $V_{high}$ in FIG. 10, the voltage may be at the low level $V_{low}$ as shown in FIG. 11.

In the first to third embodiments, an operation of writing "0" in all memory cells in the read state is performed to perform destructive read. However, in the embodiment, an operation of writing "1" in all the memory cells is performed to perform destructive read.

As an example, a read operation and a write-back operation of the Series connected TC unit type ferroelectric RAM having the configuration shown in FIG. 6 will be described below. As an example, explanation will be given to a case in which "0" is read from a selected memory cell 61b of a first unit cell group 60 connected to a word line WL2 and "1" is read in a selected memory cell 71b of a second unit cell group 70.

The read operation will be described below. As shown in FIGS. 10 and 11, a voltage of the high level $V_{high}$ is applied to the first bit line BL1 and the second bit line BL2. Thereafter, the first bit line BL1 and the second bit line BL2 are opened. Accordingly, the potentials of the first bit line BL1 and the second bit line BL2 are set in a floating state at the high level $V_{high}$.

Thereafter, a low level $V_{low}$ is applied to the word line WL2 connected to selected memory cells 61b, 71b. On the other hand, a voltage of the word lines WL1, WL3, and WL4 connected to unselected memory cells 61a, 61c, 61d, 71a, 71c, and 71d except for the selected memory cells 61b and 71b are kept in high level $V_{high}$. In this manner, transistor switches Tr of the unselected memory cells are turned on. Furthermore, a voltage is applied to the gate electrodes of a first selection transistor ST1 in the first unit cell group 60 and a second selection transistor ST2 in the second unit cell group 70. As a result, the first selection transistor ST1 and the second selection transistor ST2 are turned on. Furthermore, voltages of the first plate line PL1 and the second plate line PL2 are set at the low level $V_{low}$.

In this manner, in the first unit cell group 60, a polarization state of the ferroelectric capacitor Cf of the selected memory cell 61b in which "0" has been written moves from a position c to a position B on the hysteresis curve in FIG. 12. In this manner, a change in quantity of electric charge QcB discharged to the first bit line BL1 is represented by QcB. In the second unit cell group 70, a polarization state of the ferroelectric capacitor Cf of the selected memory cell 71b in which "1" has been written moves from a position A to a position B on the hysteresis curve in FIG. 12. At this time, a change in quantity of electric charge discharged to the second bit line BL2 is represented by QAB.

A change in voltage relevant to a change in minute charge ΔQ corresponding to a difference (ΔQ=QcB−QAB) between the quantity of electric charge QcB of the selected memory cell 61b, the charge being discharged to the first bit line BL1, and the quantity of electric charge QAB of the selected memory cell 71b, the charge being discharged to the second bit line BL2, is amplified by the differential amplifier 20. As a result, data read from the selected memory cell 61b is determined as "0", and data read from the selected memory cell 71b is determined as "1".

In the embodiment, all the ferroelectric capacitors Cf of the selected memory cells 61b and 71b hold "1" after the reading operation regardless of held data "0" or "1". For this reason, a write-back operation is performed after the read operation. The write-back operation is performed as follows like the write operation.

The write-back operation is performed subsequently to the read operation. Meantime, the transistor switches Tr of the unselected memory cells 61a, 61c, 61d, 71a, 71c, and 71d except for the selected memory cells 61b and 71b are kept in on-state.

In the write-back operation, the voltages of the first plate line PL1 and the second plate line PL2 are set at an intermediate voltage $V_{1/2}$. A voltage of the first bit line BL1 connected to the selected memory cell 61b in which "0" is written back is set at the low level $V_{low}$ equal to that in the stand-by state. On the other hand, the voltage of the second bit line BL2 connected to the selected memory cell 71b in which "1" is written is set at the high level $V_{high}$.

As described above, a voltage of the low level $V_{low}$ is applied to a bit line side electrode of the ferroelectric capacitor Cf of the selected memory cell 61b. On the other hand, a voltage of the high level $V_{high}$ is applied to a bit line side electrode of the ferroelectric capacitor Cf of the selected memory cell 71b. As a result, a polarization state of the ferroelectric capacitor Cf of the selected memory cell 61b is a polarization state directed from a plate electrode side to a bit line side. A polarization state of the ferroelectric capacitor Cf of the selected memory cell 71b is a polarization state directed from the bit line side to the plate electrode side. More specifically, the ferroelectric capacitor Cf of the first unit cell group 60 and the second ferroelectric capacitor Cf of the second unit cell group 70 are polarized in opposite directions. This state will be described below with reference to the hysteresis curve in FIG. 12. In the first unit cell group 60, the polarization state of the ferroelectric capacitor Cf of the selected memory cell 61b in which "0" has been written back moves from a position f to a position c on the hysteresis curve by making an electric field zero. A polarization state of the selected memory cell 71b of the second unit cell group 70 in which "1" has been written moves from a position B to a position A on the hysteresis curve by making the electric field zero.

Concrete voltage values of the high level $V_{high}$ and the intermediate voltage $V_{1/2}$ tend to be reduced with miniaturization and an increase in capacity of the semiconductor memory. The value changes depending on generations of ferroelectric memory devices. For example, when about 1.8V is used as a voltage of the high level $V_{high}$, the intermediate voltage $V_{1/2}$ is preferably set at about 0.9V. When about 0.6V is used as the voltage of the high level $V_{high}$, the intermediate voltage $V_{1/2}$ is preferably set at about 0.3V.

Also in the fourth embodiment, the same effects as those in the second and third embodiments can be obtained.

Figure 13:
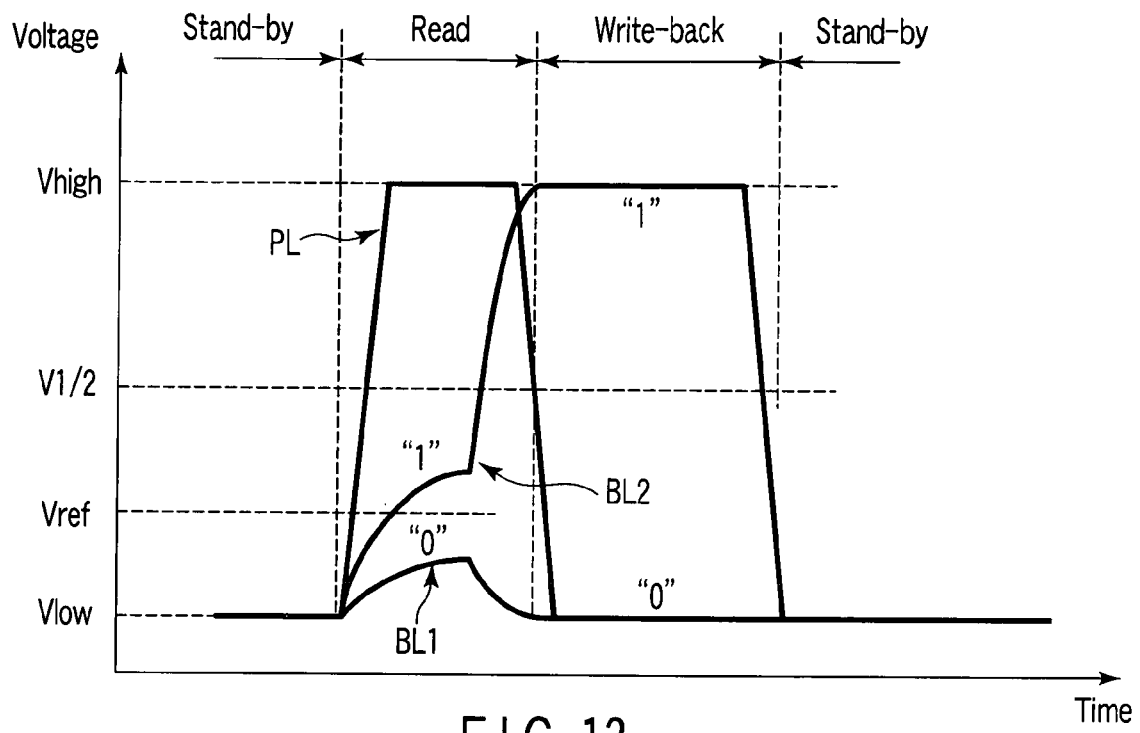
FIG. 13 is an operation timing chart of a ferroelectric RAM according to a modification of the first to third embodiments of the invention.

In the first to fourth embodiments, the case in which the intermediate voltage $V_{1/2}$ set at an intermediate value between the high level $V_{high}$ and the low level $V_{low}$ is applied to the plate line PL is explained. This is because the embodiments are caused to cope with both a memory cell in which "0" is written and a memory cell in which "1" is written. However, as shown in FIG. 3, when the voltage of the plate line PL is made higher than the voltages of the bit lines BL1 and BL2 to read data, "0" is written in all the memory cells. Therefore, a memory cell which originally holds "0" does not require the write-back operation. For this reason, only "1" may be written in the memory cell. A timing chart of the voltages of the plate line PL and the bit lines BL1 and BL2 at this time is shown in FIG. 13. As shown in FIG. 13, in the write-back operation, the voltage of the plate line PL is set at the low level $V_{low}$.

Figure 14:
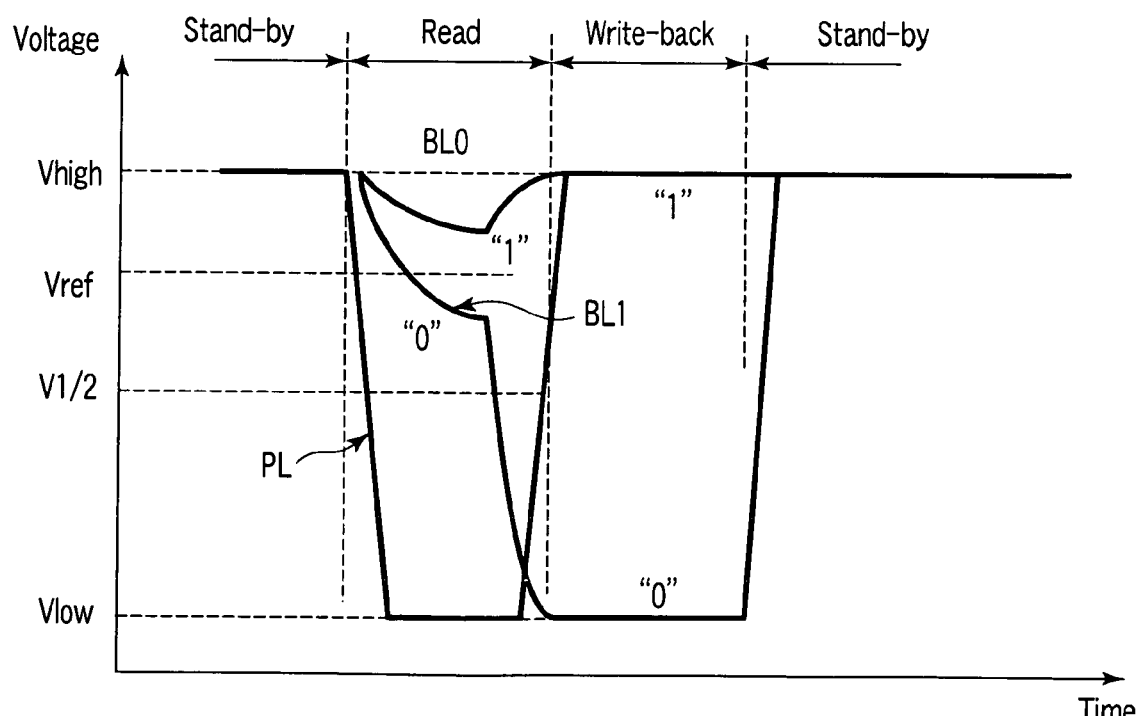
FIG. 14 is an operation timing chart of a ferroelectric RAM according to a modification of the fourth embodiment of the invention.

When data is read such that the voltage of the plate line PL is made lower than the voltages of the bit lines BL1 and BL2 as shown in FIG. 10, "1" is written in all the memory cells. Therefore, a memory cell which originally holds "1" does not require a write-back operation. For this reason, only "0" may be written in the memory cell. A timing chart of the voltages of the plate line PL and the bit lines BL1 and BL2 at this time is shown in FIG. 14. As shown in FIG. 14, in the write-back operation, the voltage of the plate line PL is set at the high level $V_{high}$.

Even though the above method is used, time required for the write-back operation can be shortened. Since a potential difference between a plate line voltage VPL and a bit line voltage VBL in the write-back operation can be made large, an erroneous write operation can be prevented.

Figure 15:
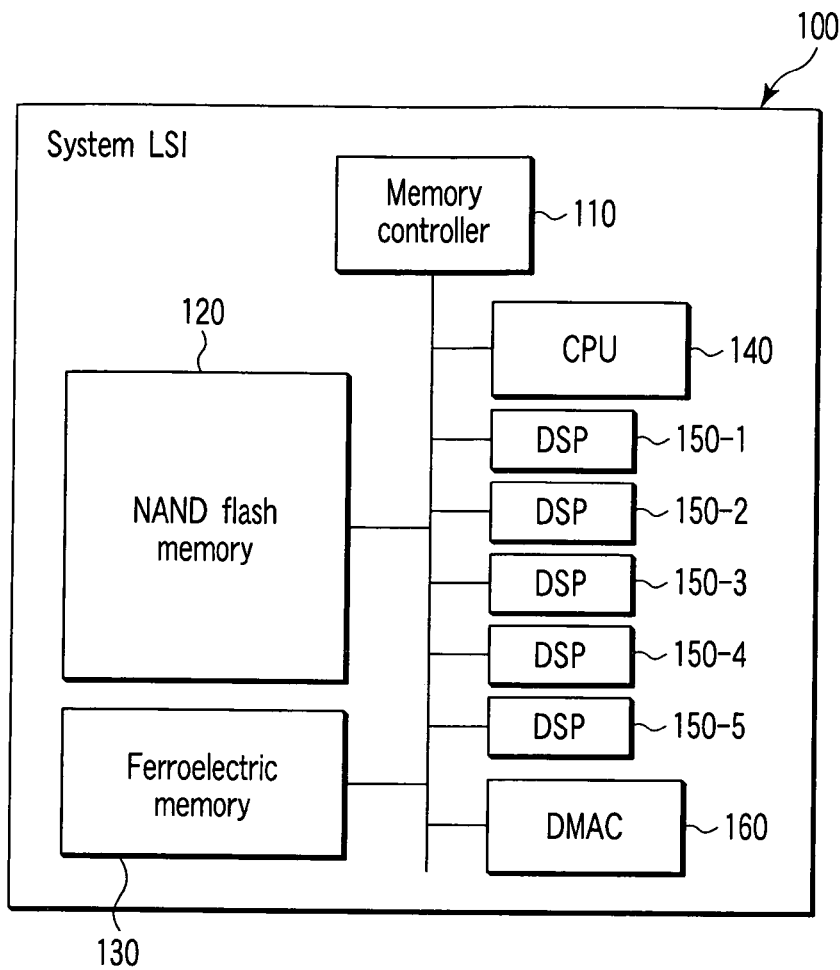
FIG. 15 is a block diagram of a system LSI including a ferroelectric memory device according to the first to fourth embodiments of the invention.

The ferroelectric memory devices explained in the first to fourth embodiments can also be applied to, for example, a system LSI in which a semiconductor memory is embedded. FIG. 15 is a block diagram of a system LSI including the ferroelectric memory devices according to the first to fourth embodiments. As shown in FIG. 15, a system 100 includes a memory controller 110, a NAND flash memory 120, a ferroelectric memory 130, a CPU 140, digital signal processors (DSPs) 150-1 to 150-5, and a direct memory access (DMA) controller 160. The NAND flash memory 120 is used as a memory device for a large-capacity data storage. The ferroelectric memory 130 is a memory device having a capacity smaller than that of the NAND flash memory 120, and is a ferroelectric memory device described in the first to fourth embodiments. The ferroelectric memory 130 is used as a buffer memory of the NAND flash memory 120. The CPU 140 and the DSPs 150-1 to 150-5 read data held in the NAND flash memory 120 through the ferroelectric memory 130 and process the data. The DMA controller 160 transfers data among the CPU 140, the DSPs 150-1 to 150-5, and the ferroelectric memory 130. The memory controller 110 controls the NAND flash memory 120 and the ferroelectric memory 130.

Figure 16:
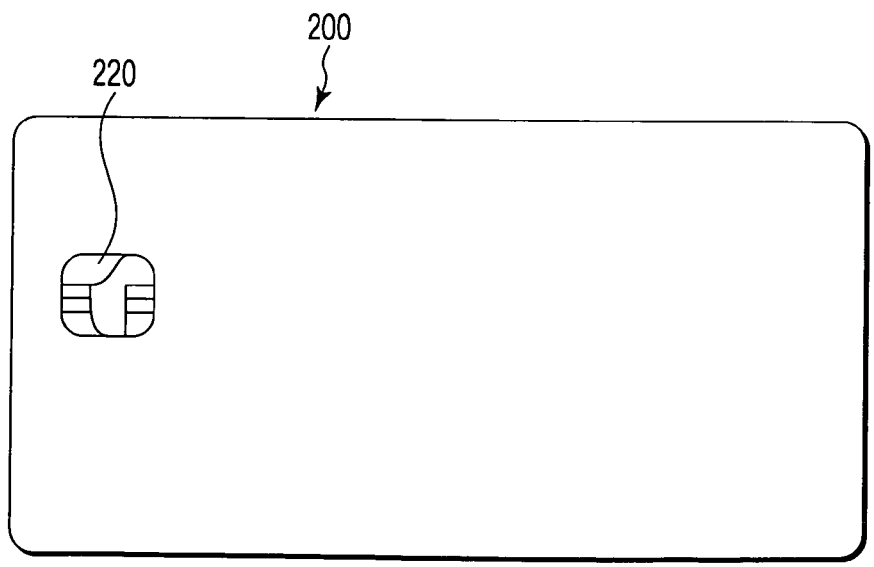
FIG. 16 is an appearance diagram of an IC card including the ferroelectric memory device according to the first to fourth embodiments of the invention.
Figure 17:
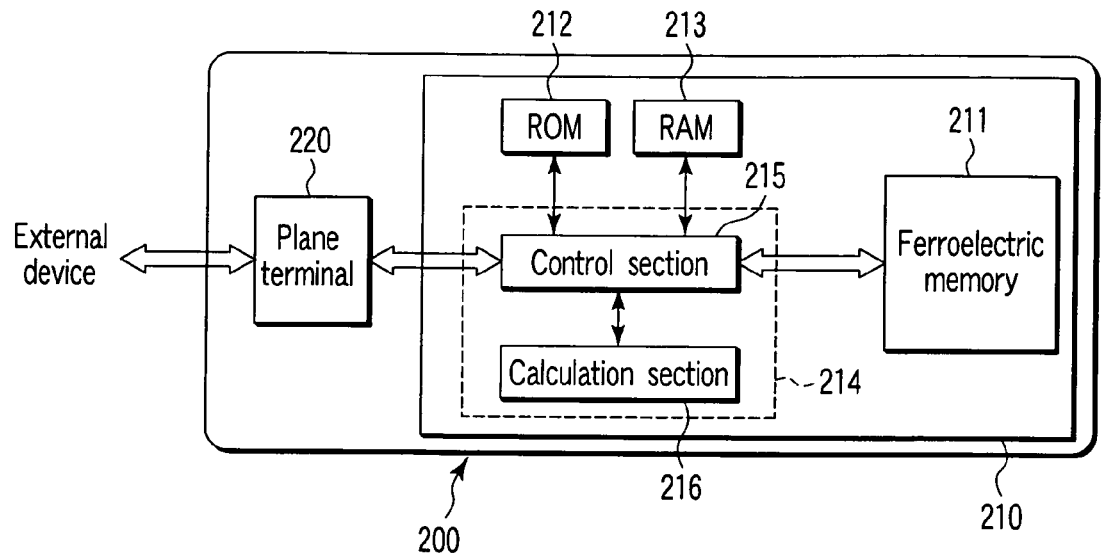
FIG. 17 is a block diagram of the IC card shown in FIG. 16.

Furthermore, the ferroelectric memory devices according to the first to fourth embodiments can be applied to, for example, IC cards. FIGS. 16 and 17 are an external view and an internal block diagram of the IC card. As shown in FIGS. 16 and 17, an IC card 200 includes an MCU 210 and a plane terminal 220. The MCU 210 includes a ferroelectric memory 211 and other circuits, for example, a ROM 212, a RAM 213, and a CPU 214. These blocks are connected to each other by a data bus. The CPU 214 includes, for example, a control section 215 and a calculation section 216. The control section 215 controls connections or the like of the circuit blocks. The calculation section 216 performs signal processing or the like. In the configuration, the ferroelectric memory device described in the embodiments can be used as the ferroelectric memory 211.

As a matter of course, the memory device can also be used as a data holding memory for a memory card, a USB memory, a portable music player, or the like.

Figure 18:
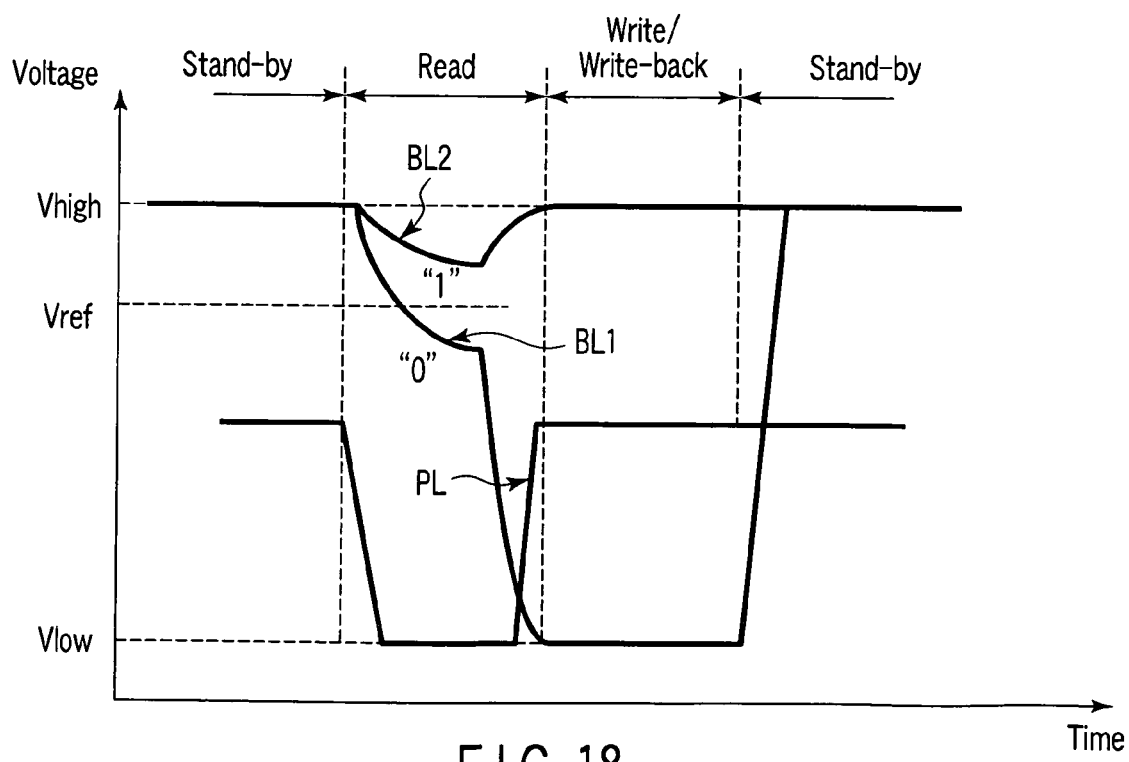
FIG. 18 is an operation timing chart of a Series connected TC unit type ferroelectric RAM according to a modification of the fourth embodiment of the invention.

In the fourth embodiment, the voltage of the plate line PL in a stand-by state may be set to a voltage between the low level $V_{low}$ and the high level $V_{high}$, as shown in FIG. 18, and the voltage of the plate line PL in the stand-by state may not be constant.

In the first and second embodiment, "0" is written in the first memory cell in which "1" is stored. In the case where "0" is written in the first memory cell in which "0" is stored, the polarization state of the first ferroelectric capacitor of the first memory cell is at a position d, and residual polarization is at a position C in FIG. 4. Therefore, the electric charge QCD is discharge at the first bit line, in read operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
a cell block including a ferroelectric capacitor and a transistor switch, the ferroelectric capacitor storing binary data by a direction of polarization of the ferroelectric capacitor;
a bit line which is connected to the cell block and applies a voltage to one electrode of the ferroelectric capacitor;
a plate line which is connected to the cell block and applies a voltage to the other electrode of the ferroelectric capacitor;
a word line connected to a gate electrode of the transistor switch; and
a differential amplifier connected to the bit line,
in a read operation of the data,
a first voltage being applied to the plate line,
a predetermined voltage being applied to the word line to activate the transistor switch for a predetermined period of time, and
a change in voltage of the bit line when the transistor switch is activated being detected by the differential amplifier to read the data, and
in a write operation of the data,
a second fixed voltage different from the first voltage being applied to the plate line,
a predetermined voltage being applied to the word line to activate the transistor switch for a predetermined period of time, and
a voltage which is higher than the second voltage or lower than the second voltage being applied to the bit line to write data in the ferroelectric capacitor.

2. The device according to claim 1,
wherein, when the first voltage is higher than a voltage of the bit line in the read operation of the data, the second voltage is lower than the first voltage, and
when the first voltage is lower than the voltage of the bit line in the read operation of the data, the second voltage is higher than the first voltage.

3. A ferroelectric memory device comprising:
unit cells each including a ferroelectric capacitor and a transistor switch, the unit cell storing binary data by a direction of polarization of the ferroelectric capacitor;
a cell block including the unit cell, the cell block including a 1T1C-type structure holding 1-bit data by the unit cell;
a bit line which is connected to the cell block and applies a voltage to one electrode of the ferroelectric capacitor;
a plate line which is connected to the cell block and applies a voltage to the other electrode of the ferroelectric capacitor;
a word line connected to a gate electrode of the transistor switch; and
a differential amplifier connected to the bit line, wherein
in a read operation of the data,
a first voltage being applied to the plate line,
a predetermined voltage being applied to the word line to activate the transistor switch for a predetermined period of time, and
a change in voltage of the bit line when the transistor switch is activated being detected by the differential amplifier to read the data, and
in a write operation of the data, a second fixed voltage different from the first voltage being applied to the plate line, a predetermined voltage being applied to the word line to activate the transistor switch for a predetermined period of time, and a voltage which is higher than the second voltage or lower than the second voltage being applied to the bit line to write data in the ferroelectric capacitor.

4. The device according to claim 3, wherein, in each of the unit cells, the ferroelectric capacitor and a current path of the transistor switch are connected in series with each other, the one electrode of the ferroelectric capacitor is connected to the bit line through the transistor switch, the other electrode of the ferroelectric capacitor is connected to the plate line, and the gate electrode of the transistor switch is connected to the word line.

5. The device according to claim 3, wherein, in each of the unit cells, the ferroelectric capacitor and a current path of the transistor switch are connected in parallel to each other, the cell block includes a unit cell group in which the plurality of unit cells are connected in series with each other and a selection transistor which selects the unit cell group, one end of the unit cell group is connected to the bit line through the selection transistor, and the other end of the unit cell group is connected to the plate line.

6. The device according to claim 3, wherein a value of the first voltage is 1.0V or more, and a value of the second voltage is 0.3V or more and less than 1.0V.

7. The device according to claim 3, wherein, when the first voltage is higher than a voltage of the bit line in the read operation of the data, the second voltage is lower than the first voltage, and when the first voltage is lower than the voltage of the bit line in the read operation of the data, the second voltage is higher than the first voltage.

8. A ferroelectric memory device comprising:

first unit cells each including a first ferroelectric capacitor and a first transistor switch, the first unit cell storing binary data by a direction of polarization of the first ferroelectric capacitor:

second unit cells each including a second ferroelectric capacitor and a second transistor switch, the second unit cell storing binary data by a direction of polarization of the second ferroelectric capacitor;

a cell block having the first unit cell and the second unit cell, the cell block having a 2T2C-type structure holding 1-bit data by the first unit cell and the second unit cell;

a first bit line which is connected to the cell block and applies a voltage to one electrode of the first ferroelectric capacitor;

a second bit line which is connected to the cell block and applies a voltage to one electrode of the second ferroelectric capacitor:

a first plate line which is connected to the cell block and applies a voltage to the other electrode of the first ferroelectric capacitor;

a second plate line which is connected to the cell block and applies a voltage to the other electrode of the second ferroelectric capacitor;

a word line connected to gate electrodes of the first transistor switch and the second transistor switch; and a differential amplifier connected to the first bit line and the second bit line, wherein in a reading operation of the data, a first voltage being applied to the first plate line and the second plate line, a predetermined voltage being applied to the word line to activate the first transistor switch and the second transistor switch for a predetermined period of time, and changes in voltage of the first bit line and the second bit line when the first transistor switch and the second transistor switch are activated being detected by the differential amplifier to read data, and in a write operation of the data, a second fixed voltage different from the first voltage being applied to the first plate line and the second plate line, a predetermined voltage being applied to the word line to activate the first transistor switch and the second transistor switch for a predetermined period of time, and a voltage which is higher than the second voltage or lower than the second voltage being applied to the first bit line and the second bit line to write data in the first ferroelectric capacitor and the second ferroelectric capacitor.

9. The device according to claim 8, wherein, in each of the first unit cells, the first ferroelectric capacitor and a current path of the first transistor switch are connected in series with each other, in each of the second unit cells, the second ferroelectric capacitor and a current path of the second transistor switch are connected in series with each other, the one electrode of the first ferroelectric capacitor is connected to the first bit line through the first transistor switch, the one electrode of the second ferroelectric capacitor is connected to the second bit line through the second transistor switch, the other electrode of the first ferroelectric capacitor is connected to the first plate line, the other electrode of the second ferroelectric capacitor is connected to the second plate line, and the gate electrodes of the first transistor switch and the second transistor switch are connected to the word line.

10. The device according to claim 8, wherein, in each of the first unit cells, the first ferroelectric capacitor and a current path of the first transistor switch are connected in parallel to each other, in each of the second unit cells, the second ferroelectric capacitor and a current path of the second transistor switch are connected in parallel to each other, the cell block has a first unit cell group in which the plurality of first unit cells are connected in series with each other, a first selection transistor which selects the first unit cell group, a second unit cell group in which the plurality of second unit cells are connected in series with each other, and a second selection transistor which selects the second unit cell group, one end of the first unit cell group is connected to the first bit line through the first selection transistor, one end of the second unit cell group is connected to the second bit line through the second selection transistor, the other end of the first unit cell group is connected to the first plate line, and the other end of the second unit cell group is connected to the second plate line.

11. The device according to claim 8, wherein a value of the first voltage is 1.0V or more, and a value of the second voltage is not 0.3V or more and less than 1.0V.

12. The device according to claim 8, wherein, in the write operation of the data, the second voltage is applied to the first plate line and the second plate line, voltages which are lower than the second voltage and higher than the second voltage are applied to the first bit line and the second bit line, respectively, and the first ferroelectric capacitor and the second ferroelectric capacitor respectively included in the first unit cell and the second unit cell which form one bit are polarized in directions different from each other.

13. The device according to claim 10, wherein, in the write operation of the data, the second voltage is applied to the first plate line and the second plate line, voltages which are lower than the second voltage and higher than the second voltage are applied to the first bit line and the second bit line, respectively, and the first ferroelectric capacitor and the second ferroelectric capacitor respectively included in the first unit cell and the second unit cell which form one bit are polarized in directions different from each other.

14. The device according to claim 8, wherein, when the first voltage is higher than voltages of the first bit line and the second bit line in the read operation of the data, the second voltage is lower than the first voltage, and when the first voltage is lower than the voltages of the first bit line and the second bit line in the read operation of the data, the second voltage is higher than the first voltage.

15. A semiconductor integrated circuit device comprising:

a flash memory device which stores data; and a ferroelectric memory device recited in claim 1.

16. A card comprising a ferroelectric device recited in claim 1.

* * * * *